(12) United States Patent
Castalino et al.

(10) Patent No.: US 9,355,739 B2
(45) Date of Patent: May 31, 2016

(54) BITLINE CIRCUITS FOR EMBEDDED CHARGE TRAP MULTI-TIME-PROGRAMMABLE-READ-ONLY-MEMORY

(71) Applicant: GLOBALFOUNDRIES INC., Grand Cayman (KY)

(72) Inventors: Pamela Castalino, Hopewell Junction, NY (US); Toshiaki Kirihata, Poughkeepsie, NY (US); Derek H. Leu, Hopewell Junction, NY (US)

(73) Assignee: Globalfoundries Inc., Grand Cayman (KY)

( * ) Notice: Subject to any disclaimer, the term of this patent is extended or adjusted under 35 U.S.C. 154(b) by 132 days.

(21) Appl. No.: 14/084,644

(22) Filed: Nov. 20, 2013

(65) Prior Publication Data

US 2015/0138868 A1    May 21, 2015

(51) Int. Cl.
*G11C 11/56* (2006.01)
*G11C 16/04* (2006.01)
*G11C 17/18* (2006.01)
(Continued)

(52) U.S. Cl.
CPC ............ *G11C 17/18* (2013.01); *G11C 11/5671* (2013.01); *G11C 16/0466* (2013.01); *G11C 16/08* (2013.01); *G11C 16/24* (2013.01); *G11C 16/26* (2013.01)

(58) Field of Classification Search
CPC .......... G11C 11/5671; G11C 16/0466; G11C 16/08; G11C 16/24; G11C 16/26; G11C 17/18
USPC .................. 365/104, 185.21, 185.23, 185.28, 365/185.33
See application file for complete search history.

(56) References Cited

U.S. PATENT DOCUMENTS 5,050,125 A    9/1991    Momodomi et al.
5,070,480 A *  12/1991  Caywood ............. G11C 15/046
                                                            365/168

(Continued)

OTHER PUBLICATIONS

"A Compact eFUSE Programmable Array Memory for SOI CMOS", Safran, et al., 2007 Symposium on VLSI Circuits Digest of Technical Papers; pp. 72-73.

(Continued)

*Primary Examiner* — Vu Le
*Assistant Examiner* — Sung Cho
(74) *Attorney, Agent, or Firm* — Scully Scott Murphy and Presser

(57) ABSTRACT

A bitline circuit for embedded Multi-Time-Read-Only-Memory including a plurality of NMOS memory cells coupled to a plurality of wordlines in each row, bitlines in each column, and a source-line. More specifically, the bitline circuit controls a charge trap behavior of the target NMOS memory array by mode-dependent bitline pull-down circuit, thereby discharging the bitline strongly to GND to trap the charge effectively in a Programming mode, and discharge the bitline weakly to GND to develop a bitline voltage to detect the charge trap state. The mode dependent circuit is realized by using at least two NMOS to switch the device strength, using a pulsed gate control in a Read mode, or using analog voltage to limit the bitline current. The proposed method further includes a protection device, allowing all bitline control circuit using thin oxide devices. The bitline circuits having mode and bank access dependent bitline circuit further enables a single device memory array, by using two arrays, wherein said one of the array is used for reference to the other array using an open bitline architecture.

15 Claims, 27 Drawing Sheets

(51) Int. Cl.
*G11C 16/08* (2006.01)
*G11C 16/24* (2006.01)
*G11C 16/26* (2006.01)

(56) References Cited

U.S. PATENT DOCUMENTS

| | | | |
|---|---|---|---|
| 5,111,428 A | 5/1992 | Liang et al. | |
| 5,341,342 A | 8/1994 | Brahmbhatt | |
| 6,243,284 B1* | 6/2001 | Kumagai | G11C 11/5692 365/104 |
| 6,438,035 B2* | 8/2002 | Yamamoto | 365/185.21 |
| 6,567,314 B1* | 5/2003 | Ogura | G11C 7/18 365/185.28 |
| 7,035,129 B1* | 4/2006 | Khanuja | G11C 17/12 365/185.25 |
| 7,817,455 B2 | 10/2010 | Fredeman et al. | |
| 2006/0133162 A1* | 6/2006 | Wang | G11C 16/12 365/189.11 |
| 2007/0047309 A1* | 3/2007 | Satoh | G11C 16/0466 365/185.17 |
| 2008/0019186 A1* | 1/2008 | Li | G11C 7/1045 365/185.22 |
| 2008/0247241 A1* | 10/2008 | Nguyen | G11C 11/5621 365/185.22 |
| 2009/0135651 A1* | 5/2009 | Kojima | G11C 16/26 365/185.16 |
| 2010/0080058 A1* | 4/2010 | Fujito | G11C 7/04 365/185.05 |
| 2010/0097839 A1* | 4/2010 | Kim | G11C 11/22 365/145 |
| 2012/0243326 A1* | 9/2012 | Maeda | G11C 16/26 365/185.21 |
| 2012/0250401 A1* | 10/2012 | Storms | G11C 13/0004 365/163 |
| 2013/0070528 A1* | 3/2013 | Maeda | G11C 16/26 365/185.11 |
| 2013/0235649 A1* | 9/2013 | Lindstadt | G11C 13/0035 365/148 |
| 2013/0286729 A1* | 10/2013 | Chih | G11C 11/5621 365/181 |

OTHER PUBLICATIONS

"A 0.13um 2.125MB 23.5ns Embedded Flash With 2GB/s Read Throughput for Automotive Microcontrollers", Demi, et al., 2007 IEEE International Solid-State Circuits Conference; pp. 478-479.

"High Performance Embedded Dynamic Random Access Memory in Nano-Scale Technologies" T. Kirihata; Springer ISBN 978-90-481-9215-1, Chapter 10, pp. 295-336.

"22nm High-Performance SOI Technology Featuring Dual-Embedded Stressors, Epi-Plate High-K Deep-Trench Embedded DRAM and Self-Aligned via 14LM BEOL", Narasimha, et al., IEEE IEDM, Dec. 2012.

"5.5GHz System z Microprocessor and Multichip Module", Warnock, et al., IEEE International Solid-State Circuits Conference; 2013.

\* cited by examiner

| Mode | WL | BL | SL |
|---|---|---|---|
| Standby | GND (0V) | VDD (1V) | VDD (1V) |
| Program | EWLH (2V) | GND (0V) | EBLH (1.5V) |
| Read | VDD (1V) | *VDD - VT | VDD (1V) |
| Reset | NWLL (-1V) | VDD (1V) | VDD (1V) |

* BL is weakly forced to GND such that BL voltage is naturally generated to VDD - VT by source follower mode, where the VT is determined by the programming state of the NMOS.

FIG. 9C

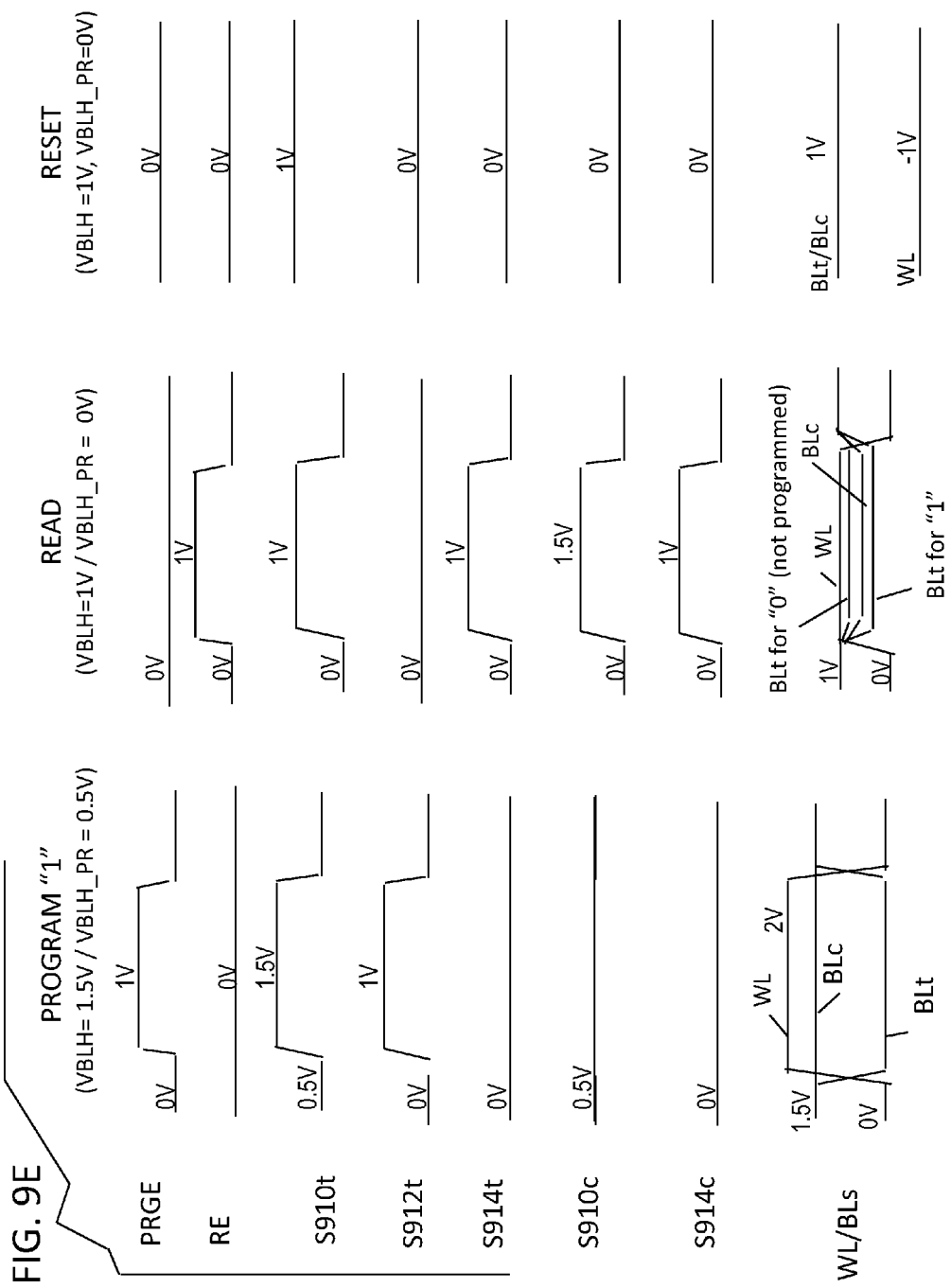

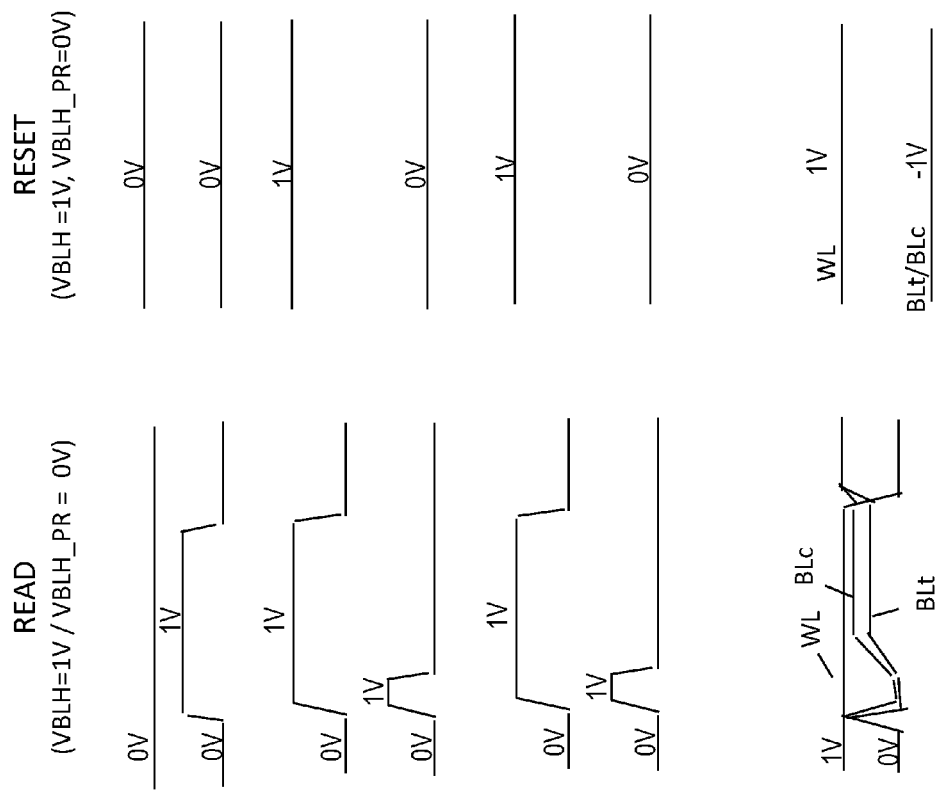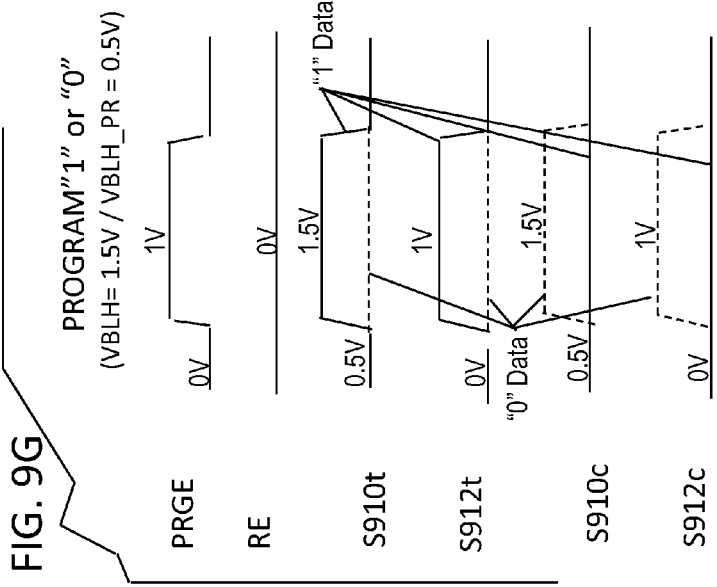
FIG. 9G

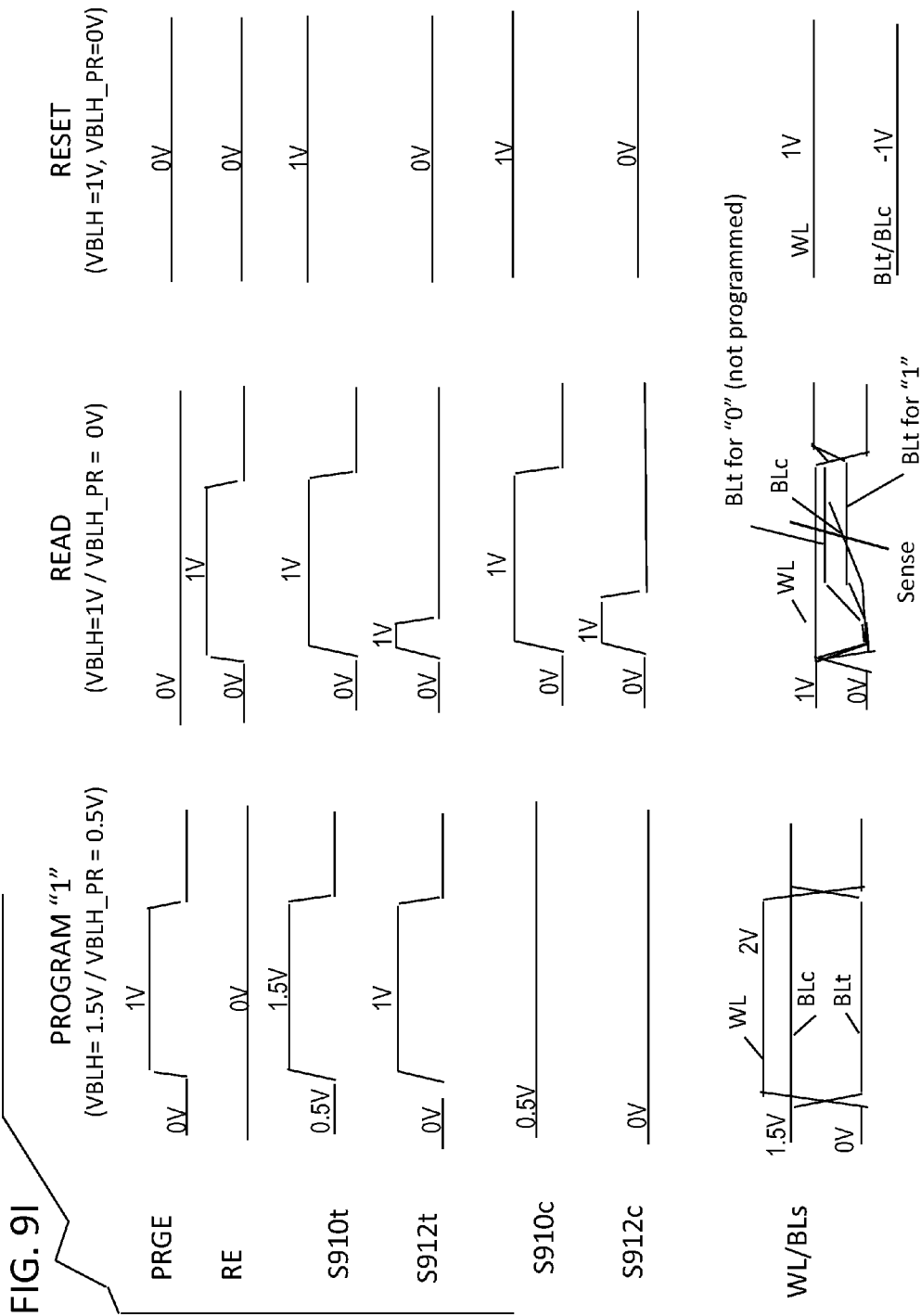

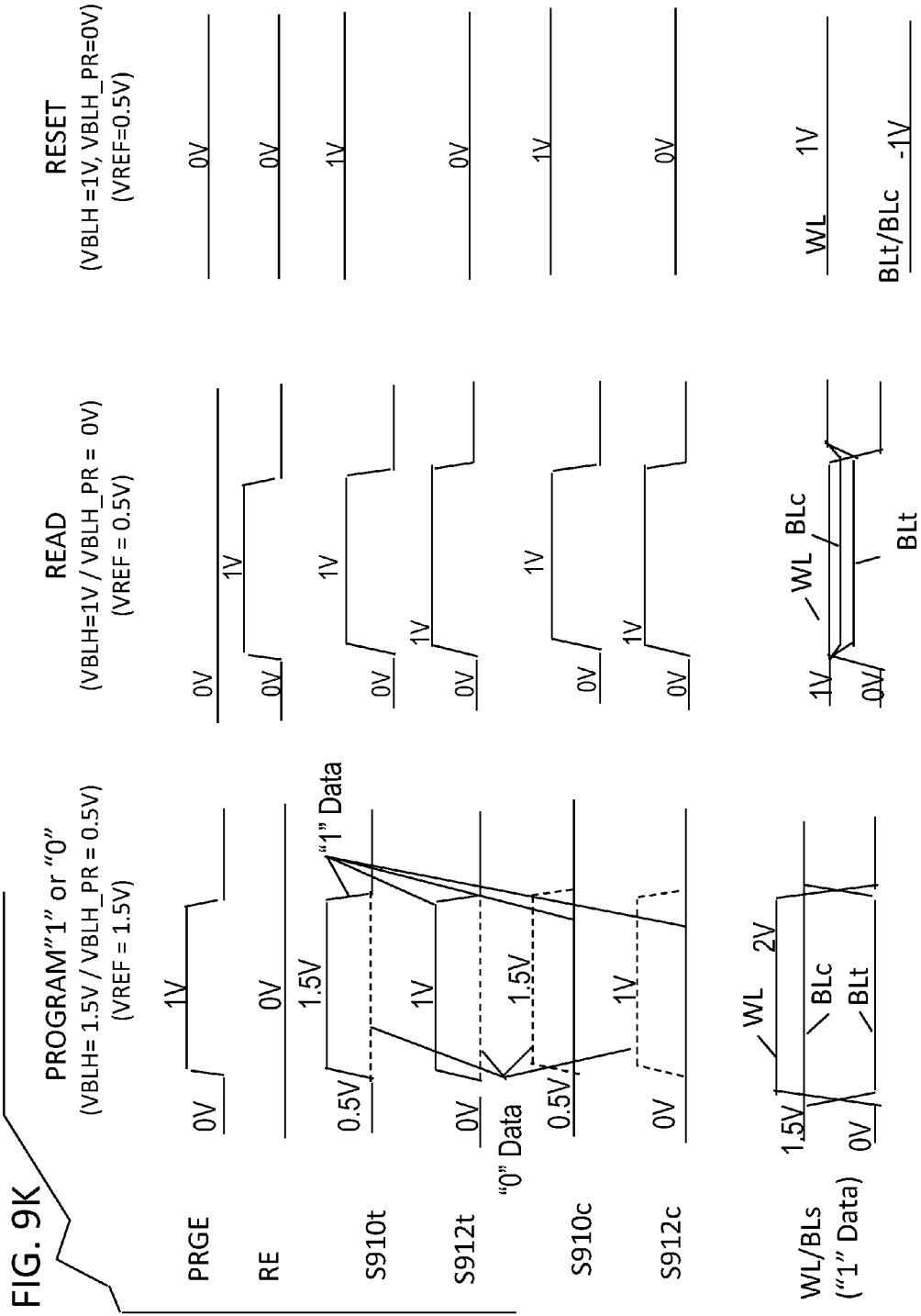

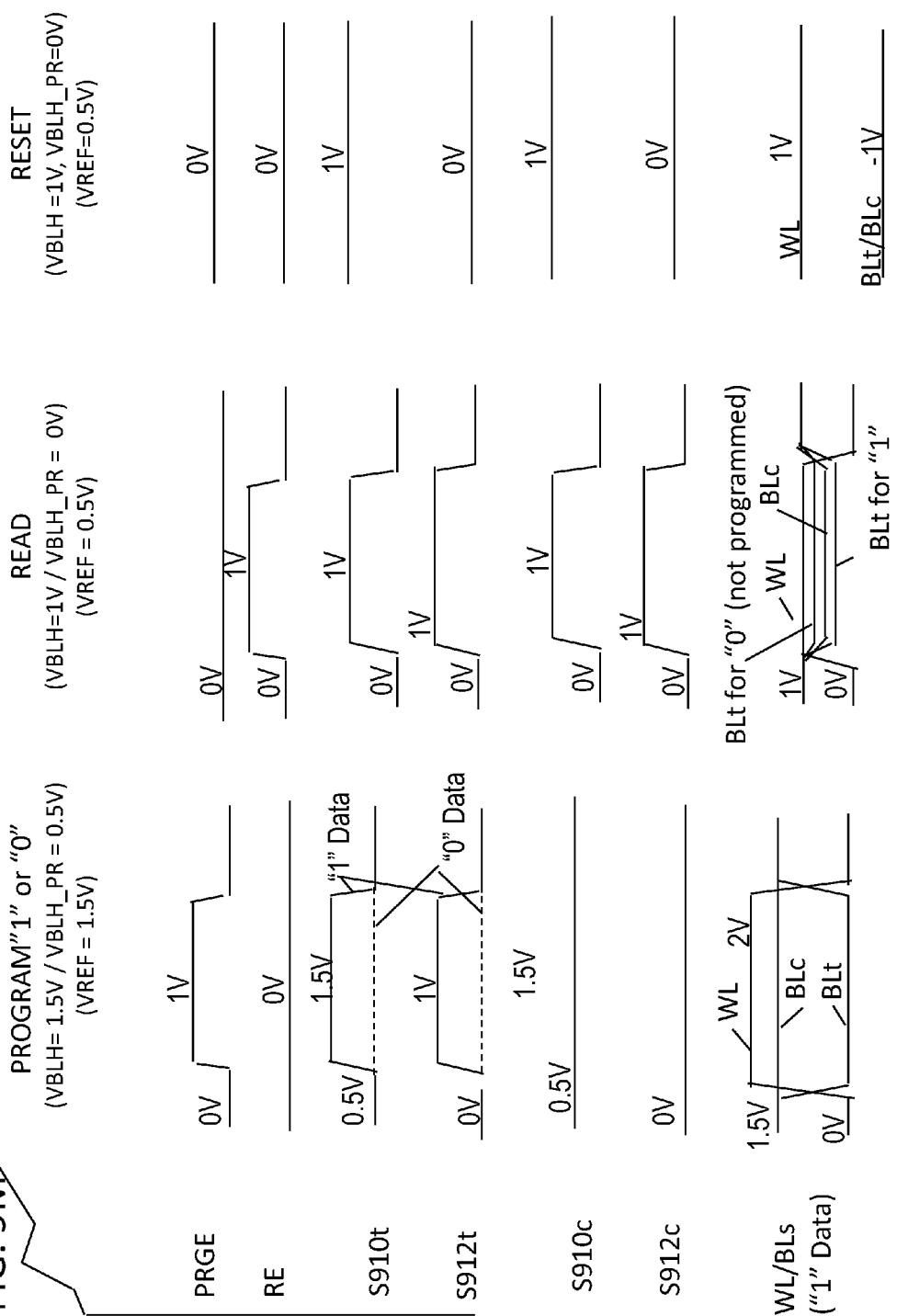

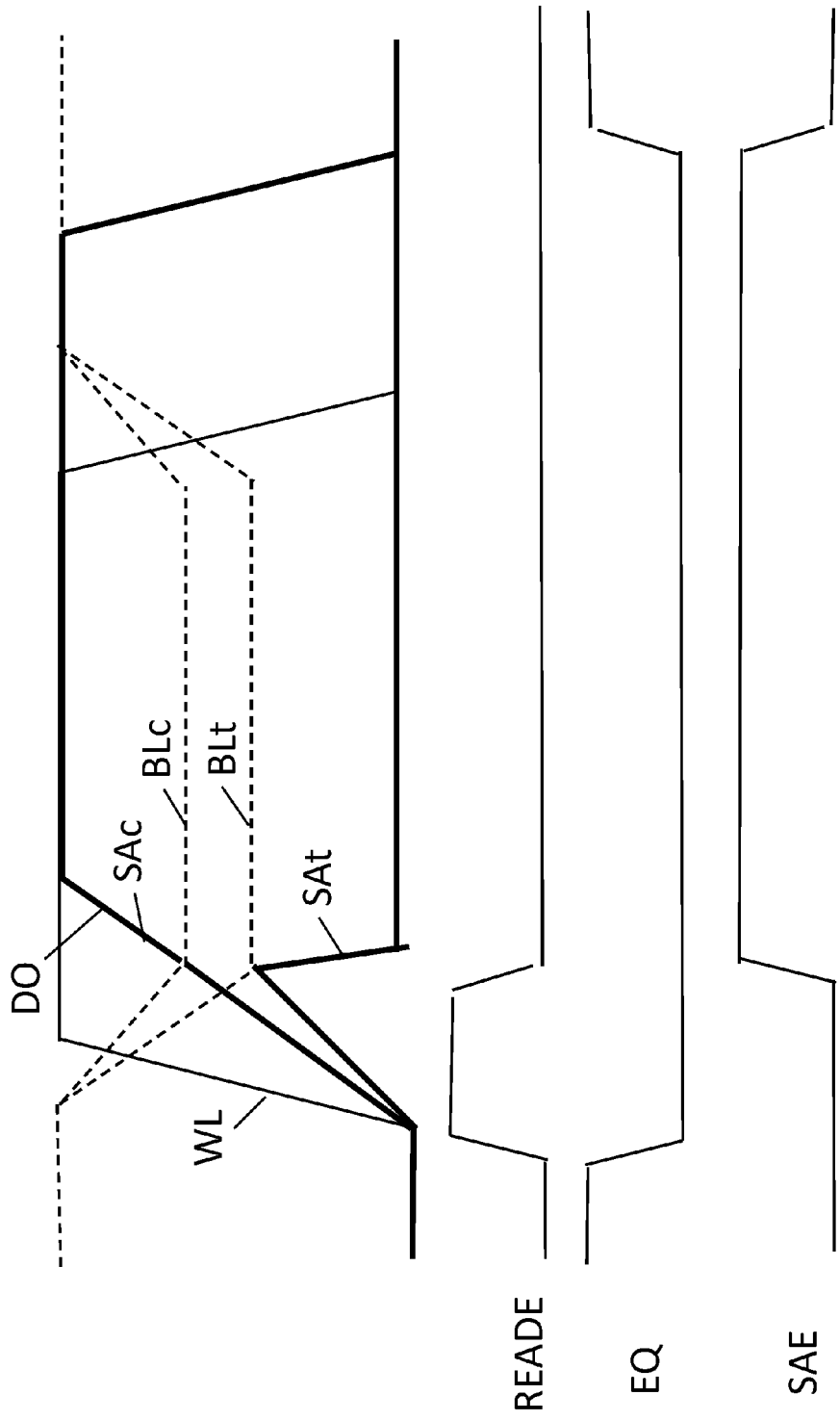

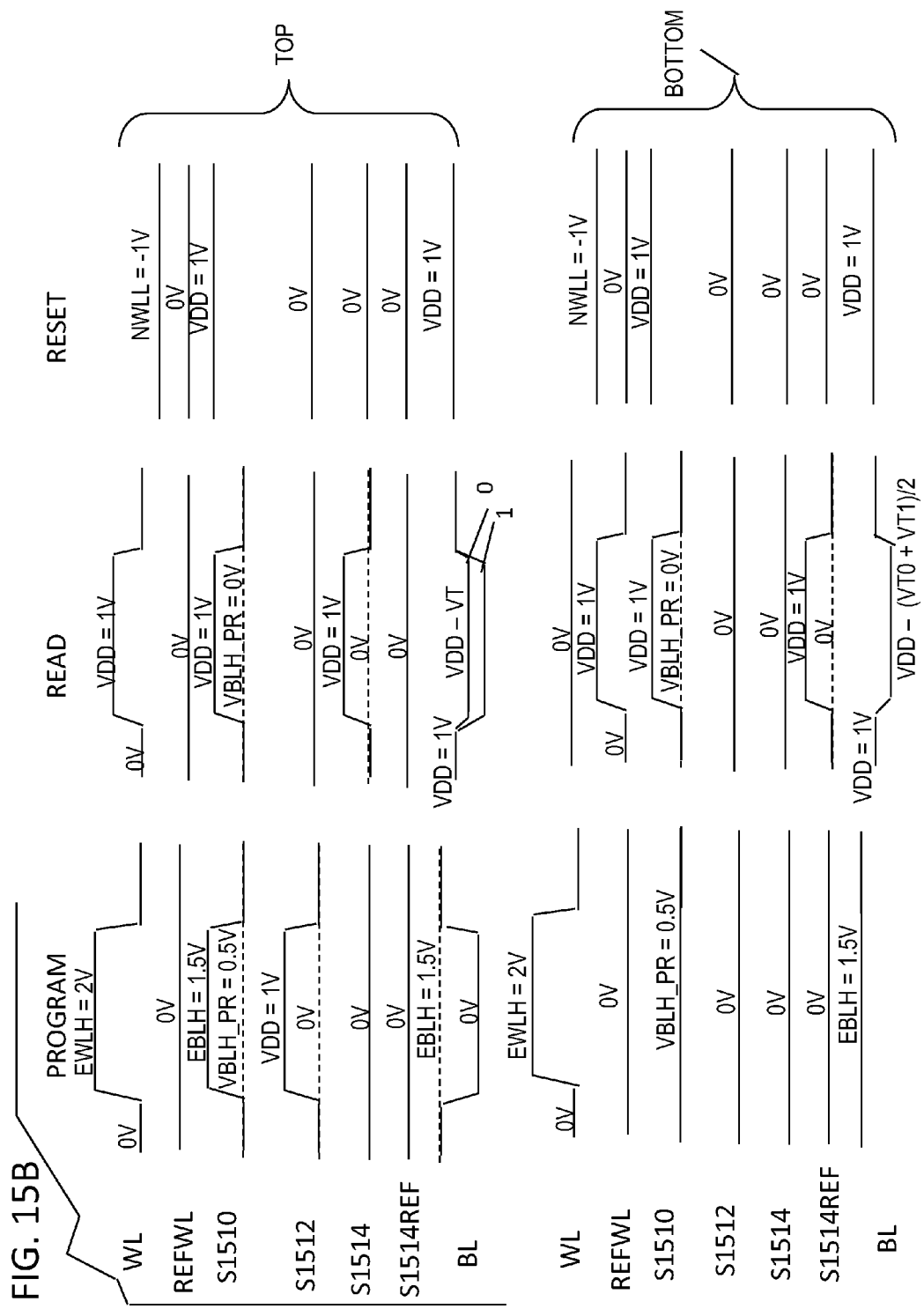

US 9,355,739 B2

BITLINE CIRCUITS FOR EMBEDDED CHARGE TRAP MULTI-TIME-PROGRAMMABLE-READ-ONLY-MEMORY

CROSS-CORRELATION TO RELATED PATENTS

This application is related to patent application Ser. Nos. 14/084,646 and 14/084,641, filed concurrently and incorporated by reference in all their details.

FIELD OF THE INVENTION

The invention describes the array architecture, structure, and voltage control method to design an embedded Multi-Time-Programmable-Read-Only-Memory (eMTPROM) using a charge trap behavior for MOSFET devices. More particularly, the invention describes bitline circuits for the eMTPROM.

BACKGROUND

A conventional approach to embedded non-volatile memory is to use an electrical fuse (hereinafter referred to as eFUSE) which is rapidly becoming unfavorable in area efficiency as the technology continues to scale down. The eFUSE, typically, does not allow reprogramming data bits, resulting in a one time programmable ROM. High density nonvolatile memories such as, e.g., NAND or NOR type flash memory overcome these problems. However, inherently adding undesirable device structures such as a floating gate or ultra-thick oxide, and electrical parasitics (excessive capacitance, high voltages, typically greater than 5V), are not supported in high performance logic technologies which requires complex additional process elements to be integrated to the high-performance logic technologies, resulting in high cost.

SUMMARY

In one aspect, an embodiment of the invention provides bitlines circuits that include a mode-dependent pull-down circuit to control a bitline condition that maximizes the charge trap efficiency for programming, while improving a signal development on the bitline during a read mode operation.

In another aspect, an embodiment provides bitline circuits that control a charge trap behavior of an N-type MOSFET (NMOS) memory array coupled to a Meshed-Source-Line-Network (MSLN) not having a floating gate (FG). Bitline circuits control the bitline voltage to trap the charge (also referred to as electrons or e⁻) in a dielectric of the targeted NMOS. The initial NMOS threshold voltage ($VT_0$) of the targeted NMOS increases to $VT_1$ by a predetermined $\Delta VT$ when in a Programming mode. The bitline circuits also control the bitline voltage not trapping the charge in the dielectric of the untargeted NMOS such that the threshold voltage of the untargeted NMOS remains unchanged during the targeted NMOS Programming mode. The bitline is also employed for detecting the trapped state by developing a $VT_0$ and $VT_1$ dependent voltage on the bitline. The bitline circuits include a sense amplifier for a digital output. The trapped charge (e⁻) can be eliminated to recover the initial $VT_0$ by applying a reset condition.

In an embodiment, a pull-down circuit includes two switching devices controlling the strength of discharging the BL voltages. The BL voltage is strongly discharged to GND for an effective charge trapping during Programming mode, and weakly discharges to GND for emulating a source follower condition to develop the voltage on the bitline during Read mode.

In an embodiment, the pull-down circuit includes a switching device controlling a period of discharge the BL voltage such that the BL voltage is constantly discharged to GND for an effective charge trapping during Programming mode, while periodically discharging to GND to emulate the source follower condition to develop the voltage on the bitline during Read mode.

In an embodiment, the pull-down circuit includes a switching device, which serially couples a current source device, controlling the strength for discharging the BL voltages such that the BL voltage is strongly discharged to GND for an effective charge trapping during a Programming mode by applying a higher voltage gate voltage to the current source device, and weakly discharging to GND by applying a lower gate voltage to the current source device, emulating a source follower condition to develop the voltage on the bitline when in Read mode.

The bitline circuits in the aforementioned three embodiments preferably use a bitline high voltage (VBLH) raised to an elevated bitline voltage (EBLH) when in said Programming mode, while using a VDD voltage during other modes. This results in an effective charge trapping in a Programming mode.

The bitline circuits can include a protection device enabling the bitline driver circuit that uses only a thin-oxide transistor, including a cross-coupled sense amplifier with a protective device between the bitline and the sense amplifier.

In an embodiment, the pull-down circuit controls a charge trap behavior of an N-type MOSFET (NMOS) memory array coupled to a Meshed-Source-Line-Network (MSLN), including a plurality of NMOS twin memory cells without floating gate (FG), where one of each twin NMOS cell traps the charge by discharging one of the bitline true and complements a pair coupled to a twin NMOS, developing a $VT_0$ and $VT_1$ dependent voltage on the bitline true complemented by discharging both in Read mode, and where the strength of the discharging device is controlled by the mode-dependent pull-down device, and wherein the discharging strength of the Program is greater than while in Read mode. The trapped charge (e⁻) in one of each twin NMOS can be eliminated in order to recover the initial $VT_0$ by applying a Reset condition.

In an embodiment, the pull-down circuit controls the charge trap behavior of an N-type MOSFET (NMOS) memory array coupled to the MSLN, including a plurality of NMOS twin memory cells without floating gate (FG), where only a true side of the twin NMOS cell traps the charge as a data bit of 1 state, discharging the bitline true coupled to the true side of the twin NMOS. Otherwise, it does not trap the charge as a data bit of 0 state and develops a voltage on the bitline true by discharging the mode-dependent pull-down circuit, and developing a reference voltage on the bitline complement discharging the mode-dependent pull-down circuit. The strength of the discharging device is controlled by the mode-dependent pull-down device such that the discharging strength during Programming is greater than during Read mode, and the strength of the bitline complement side in the Read mode is somewhat more than the bitline true side, detecting a charge trap state (either trapped state as a data bit of 1 or non-trapped state as a data bit of 0 in true side of the NMOS. The trapped charge (e⁻) in one of each twin NMOS can be eliminated to recover the initial $VT_0$ by applying a reset condition.

In an embodiment, an embedded multi-time Programmable memory uses two NMOS memory arrays, each having a plurality of NMOS having each serve a storage element, wherein an array is used for creating a reference bitline voltage for the other array. The two arrays can share the sense amplifiers with each coupled to the bitline from the two arrays of an open-bitline array structure. Each bitline of each array is controlled by its mode and by a bank access dependent pull-down circuit to change the bitline discharging strength, and create a differential signal that activates a wordline of the activated array. It further activates a reference wordline in a reference array.

BRIEF DESCRIPTION OF THE DRAWINGS

Embodiments of the present invention will be understood and appreciated more fully from the following detailed description of the invention taken in conjunction with the accompanying drawings of which:

FIG. 9 illustrates bitline circuits controlling a true bitline (BLt) and a complement bitline (BLc) in one column, wherein the detailed of preferred embodiments are shown in FIGS. 9A to 9C, 9E, 9G, 9I, and 9K, and their corresponding timing diagrams shown in FIGS. 9B, 9D, 9F, 9H, 9J, and 9L, respectively. More particularly:

FIG. 9C shows corresponding timing diagrams for the embodiment shown in FIG. 9B.

FIG. 9E shows corresponding timing diagrams for the embodiment shown in FIG. 9D.

FIG. 9G shows the corresponding timing diagrams for the embodiment shown in FIG. 9F.

FIG. 9I shows corresponding timing diagrams for an embodiment shown in FIG. 9H.

FIG. 9K shows corresponding timing diagrams for the embodiment shown in FIG. 9J.

FIG. 9M shows corresponding timing diagrams for the embodiment illustrated in FIG. 9L.

FIG. 14 illustrate a detailed operation of the sense amplifier described by way of timing diagrams.

FIG. 15-1 shows an open bitline architecture using two NMOS arrays, wherein each array consists of a plurality of NMOSs, each serving as a storage element, doubling the memory cell density.

FIG. 15-2 illustrates a detailed operation described by way of timing diagrams.

DETAILED DESCRIPTION

Figure 1:
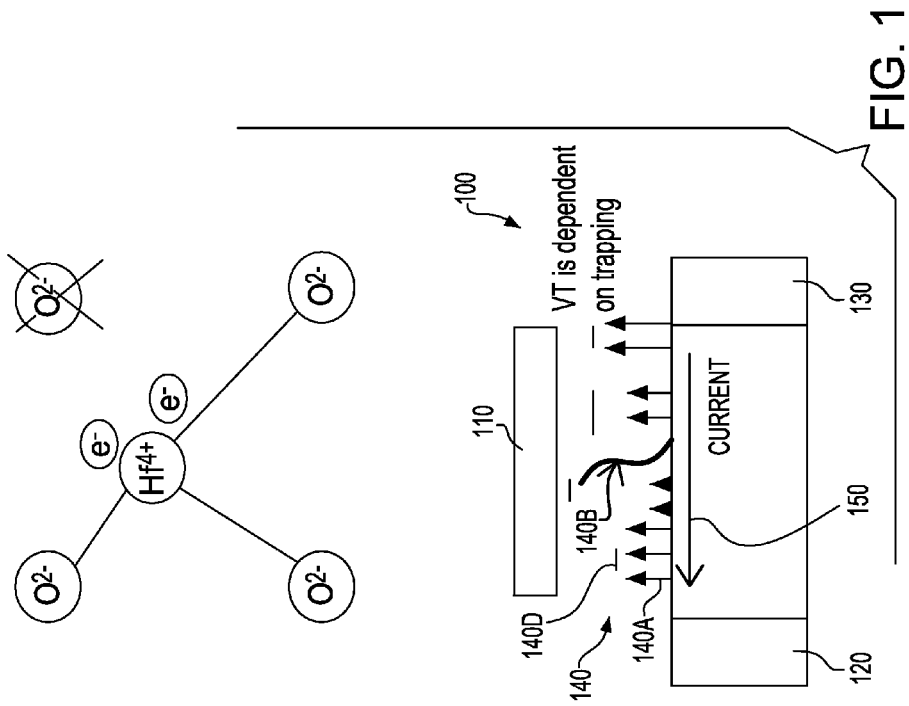
FIG. 1 shows a prior art charge trap memory cell using high performance logic NMOS devoid of a floating gate (FG).

Referring to FIG. 1, a basic charge trap memory cell is illustrated. The charge trap memory preferably uses a high performance logic NMOS without floating gate (FG). The NMOS has an initial threshold voltage of $VT_0$ for 0 data. For when in said Programming mode, the charge trap memory cell preferably uses a behavior to trap some electrons ($e^-$) to the vacancy of oxygen ($O_2$) in the dielectric (140) of NMOS (100). The NMOS is provided with a High-K dielectric, such as Hafnium ($Hf_4$) oxide that demonstrates the charge trapping behavior. The High-K material dielectric is advantageously used for high performance logic technology. The vacant oxygen point (140D) in $Hf_4$ oxide (140) traps electrons (140A) in a condition that applies a high voltage to the gate (110) while applying a high voltage between the source (120) and the drain (130), such that the NMOS strongly turns on to flow a large current through channel (150). The trapped charge ($e^-$) increases the NMOS threshold voltage to $VT_1$ (=$VT_0+\Delta VT$). The trapped electrons ($e^-$) (140B) can be eliminated by applying a negative voltage between the gate (110) and the source (120), resulting in recovering the $VT_0$ condition.

Figure 2:
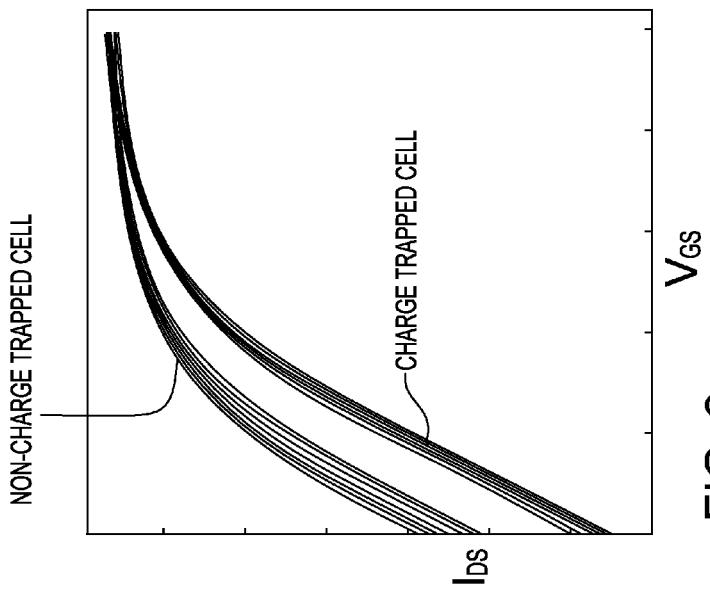
FIG. 2 illustrates a MOSFET measured source to drain current (IDS) with respect to the gate to source voltage (VGS) of an $Hf_4$ NMOS transistor.

FIG. 2 shows the measured source to drain current ($I_{DS}$) with respect to the gate to source voltage ($V_{GS}$) of the $Hf_4$ NMOS transistor (100). The $I_{DS}$ can be measured while applying the Programming and resetting the conditions several times. As expected, trapping the electrons increases the NMOS threshold, resulting in a smaller current than that without trapping. The $VT_1$ of the charge trapped NMOS can be successfully reset to $VT_0$ of a non-charge trapped NMOS.

In an embodiment, the charge trap memory uses the charge trapping behavior to store a data bit. The memory does not require floating the gate (FG) because the charge ($e^-$) is trapped in the dielectric of the high performance logic NMOS. This results in an ideal solution to develop the embedded Multi-Time-Programmable-Read-Only-Memory (eMTPROM) preferably for a high performance logic technology. The challenge of eMTPROM is to maximize the charge trap efficiency with a simple control while protecting the high performance NMOS device. Preferably, it uses a thin oxide and a low threshold voltage, where the bitline circuits are a key to effectively trap the charge and detect the trapping state for the digital output.

Figures 3, 4:
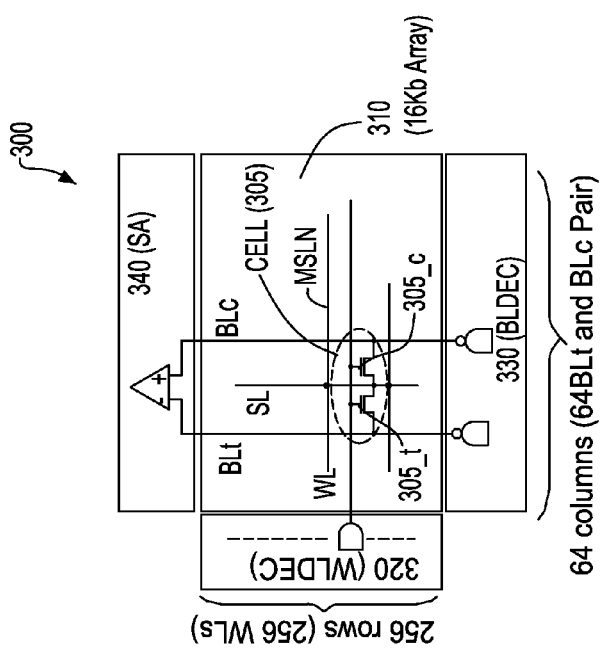
FIG. 3 shows a chip architecture configuring an eMTPROM.
FIG. 4 shows target voltage conditions for WL, BL, and SL listed in Standby, Program, Read, and Reset modes.

Referring to FIG. 3, a chip architecture is shown to configure the eMTPROM (300) consisting of a NOR-type NMOS array (310), a wordline decoder block (320: WLDEC), a bitline decoder block (330: BLDEC) and a sense-amplifier block (340 SA), where BLDEC (330) and SA (340) are the bitline circuits. In an embodiment, a NOR-type NMOS array (310) preferably employs a twin NMOS memory cell using two NMOS per one bit in a 16 Kb density. More specifically, 16 Kb array consists of 16K cells (305) each having two NMOS [not shown] referenced as 305_t and 305_c arranged in 256 rows coupled to 256 wordlines (WLs) and 64 columns coupled to 64 bitline true (BLt) and bitline complement (BLc) pairs in a two dimensional matrix. The twin NMOS cell (305) couples the Source-Line (SL) and the Meshed-SL-Network (MSLN) in the entire memory 16 Kb array.

The 256 rows are controlled by wordline decoder block (320: WLDEC) to activate one out of the 256 rows (or 256 WLs) for Programming and Read modes. When a WL is activated, 64 cells coupled to the activated WL are simultaneously selected. For a Programming (write) mode, 8 out of 64 columns are selected to strongly discharge the targeted bitline to GND by the bitline decoder block (330: BLDEC). BLDEC controls the corresponding column, each having the BLt and BLc pair such that the 8 bits parallel Programming out of 64 columns are enabled simultaneously. The ⅛ selection is preferred in order to avoid a large voltage drop in view of the charge trapping in a Programming requiring a large current. When in a Read mode, 64 sense amplifier blocks (340: SA) can be used for sensing all the 64 bits selected by the activated WL since the read current is significantly less than the Programmed current. Optionally, SA (340) can employ an additional decoder to reduce the number of read bits, if required.

Referring to FIG. 4, target voltage conditions for WL, BL, and SL are illustrated in Standby, Program, Read, and Reset modes, wherein BL is weakly forced to GND such that the BL voltage is naturally generated to VDD-VT by source follower mode, and where VT is determined by the Programming state of the NMOS.

Standby Mode

Figure 5:
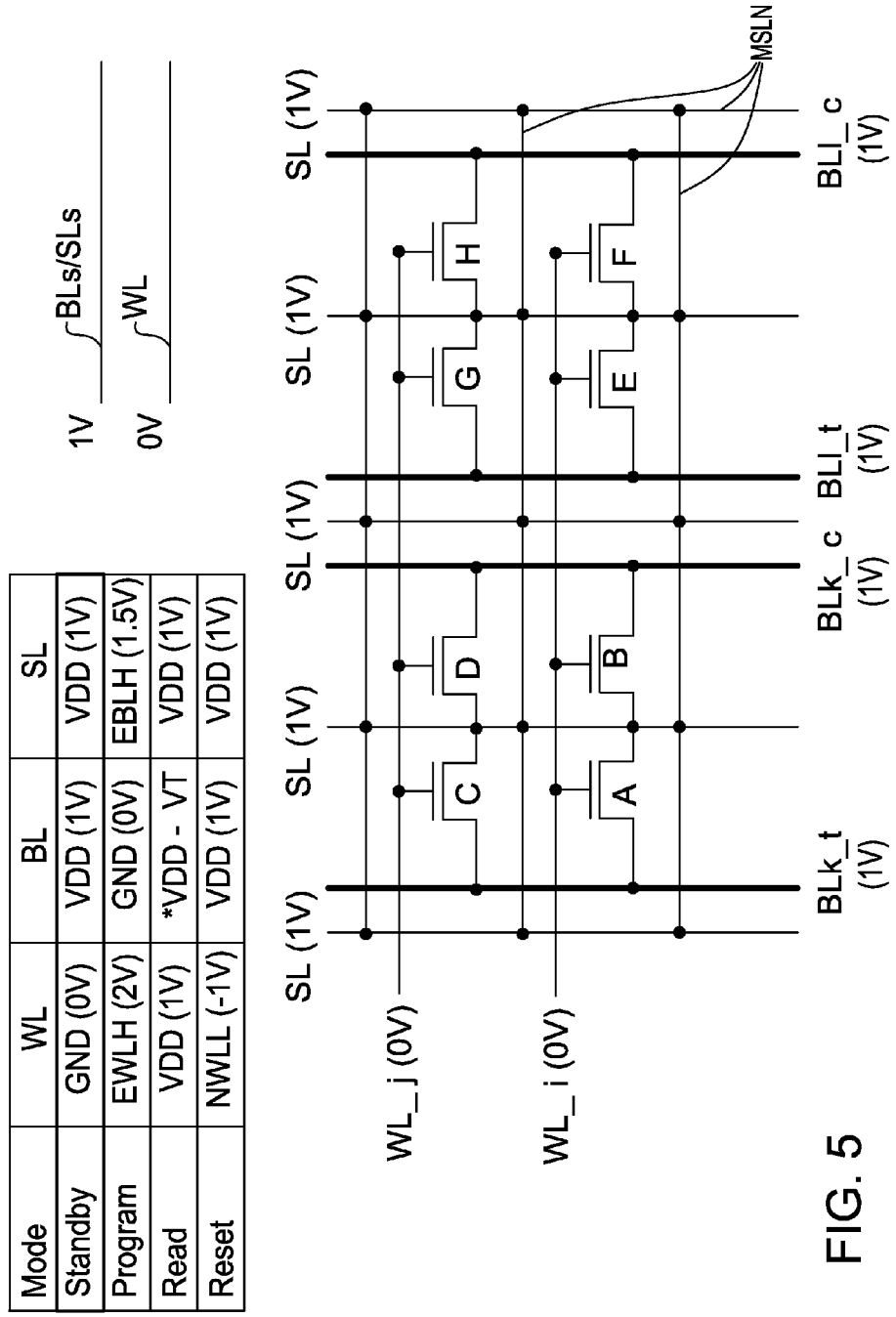
FIG. 5 shows when in Standby mode, an idle state where the eMTPROM is waiting for a command for Programming, Read, or Reset mode operations.

Referring to the Standby mode, FIG. 5 illustrates an idle state wherein the eMTPROM is waiting for a command for Programming, Read, or Reset mode operations. Both WLDEC and BLDEC do not select any rows or columns. All the WLs, BLs, and SLs stand in a default state, or alternately, GND(0V), VDD(1V), and VDD(1V), respectively, turning off all the NMOS (A, B, C, D, E, F, G, H).

Programming Mode

Figure 6:
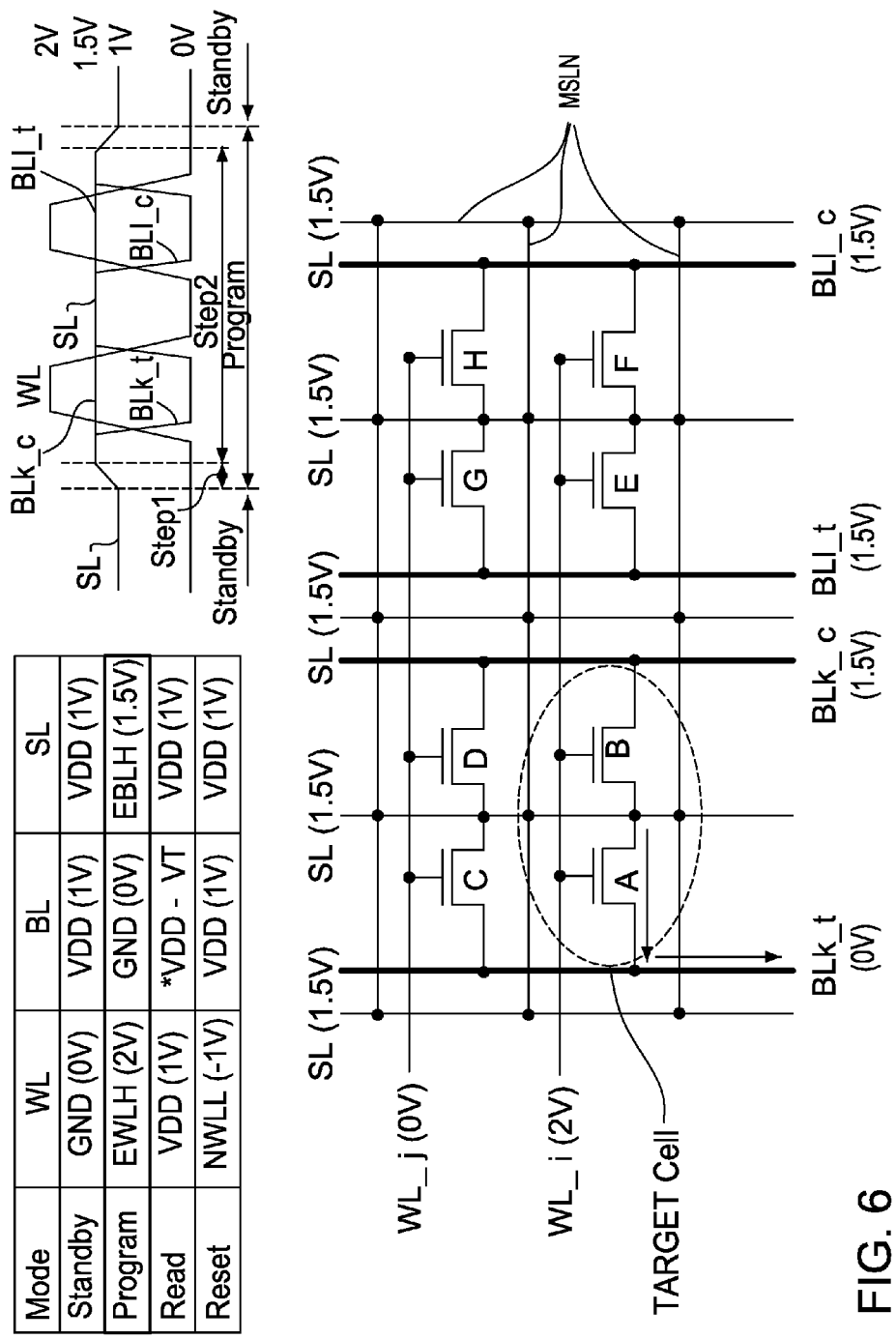
FIG. 6 shows the Programming mode for trapping the charge to the TARGET cell.

The Programming mode illustrated in FIG. 6 can be used for trapping the charge (electrons) to the target cell (TARGET). Prior to enabling the Programming mode, all the NMOS in all the cells begin with an initial threshold voltage ($VT_0$). Following the Programming mode, The threshold voltage is increased to $VT_1=VT_0+\Delta VT$ due to the charge trapping to the dielectric of the NMOS. Moreover, one of two NMOS (A) in the target cell traps the charge (electrons) to increase the threshold voltage to $VT_1=VT_0+\Delta VT$ due to the charge trapping the dielectric of the NMOS (A). The second NMOS (B) of the target cell remains at $VT_0$. The charge ($e^-$) trapping can be realized in the two following steps:

First Step: when the Programming mode is enabled, the BL and SL voltages in the entire array rises from VDD to an elevated bitline high voltage (EBLH) of 1.5V, while keeping all the WLs at GND (0V) in Standby state. The voltage condition (BL=SL=1.5V) preferably remains unchanged until the Programming mode switches to another mode.

Second Step: The wordline (WL_i) coupled to the target NMOS (A) rises to an elevated wordline high voltage (EWLH) of 2V. Concurrently, BLDEC drives BL (i.e., BLK_t) coupled to the target NMOS (A) until BL is completely discharged to GND (0V). This results in a large current flow from SL to BL (i.e., BLK_t) through the target NMOS (A), where electrons can be trapped at vacant oxygen points in the dielectric of the targeted NMOS (A). BLDEC holds the other BL (i.e., BLk_c) coupled to NMOS (B) in the untargeted cell remaining at EBLH=1.5V, resulting in no current flowing through the NMOS (B). The threshold voltage of NMOS(B) therefore remains unchanged since no electrons are trapped. All the other NMOS (E and F) coupled to the same activated WL (WL_i) also maintain the BL voltage at 1.5V, leaving VT (either $VT_0$ or $VT_1$) previously programmed (or not programmed) during the TARGET cell programming. All the cells coupled to the other WLs (i.e., WL_j) stand at 0V which disables all the NMOS (C,D,G,H) for the unselected row. The threshold voltage of NMOS (C,D,G,H) remains therefore unchanged during TARGET cell programming.

Read Mode

Figure 7:
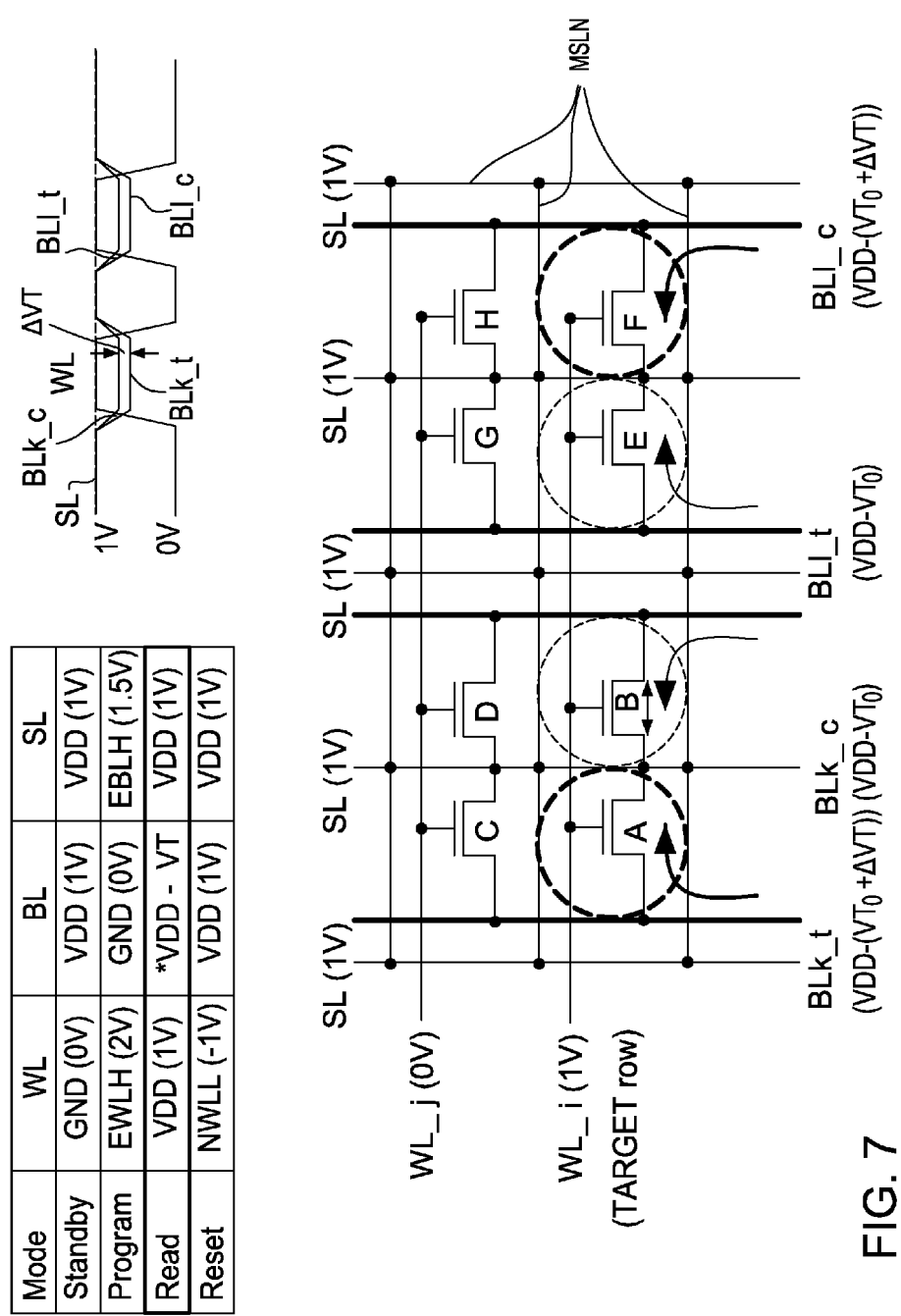
FIG. 7 depicts a Read mode used for detecting a charge trap condition for the cell, outputting the data as a binary bit per target cell.

Referring to FIG. 7, the Read mode can be used for detecting the charge trap condition for the CELL, outputting the data as a binary bit per target cell. More specifically, the wordline (WL_i) coupled to the target row is raised to VDD (1V). Concurrently, BLDEC weakly discharges all the BLs while maintaining SL at VDD (1V). Alternatively, BLDEC periodically discharges all the BLs to GND while holding SL at VDD (1V). This allows emulating the source follower condition in view of the NMOS (A,B,E,F) coupled to the activated WLs (WL_i) that naturally turn off when the BL voltage is close to VDD−NMOS threshold voltage ($VT_0$ or $VT_1$). Because one of the two NMOS in each cell traps the charge, BL (BLk_t and BL1_c) coupled to the charge trapped NMOS (A,F) becomes VDD−$VT_1$. The other BLs (BLk_c and BL1_t) coupled to the untrapped NMOS (B,E) becomes VDD−$VT_0$, resulting in creating a differential voltage of $\Delta VT$ for the column (i.e., BLt and BLc pair). The differential voltage on the BL pair can be sensed by using sense amplifier blocks (340: SA in FIG. 3).

Reset Mode

Figure 8:
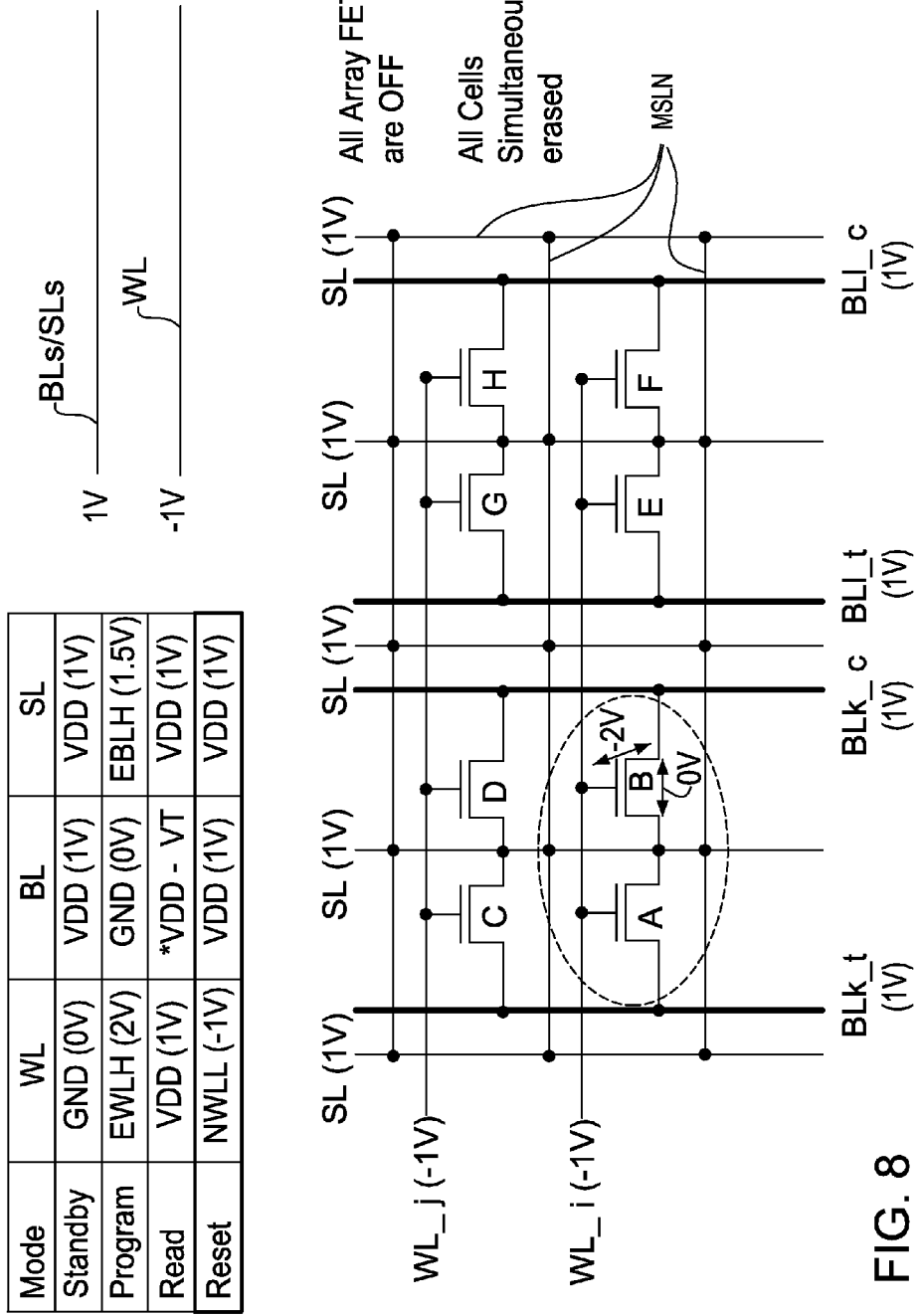
FIG. 8 depicts a Reset mode used for untrapping the charge to the target cell (TARGET).

The Reset mode depicted in FIG. 8 is used for untrapping the charge ($e^-$) such that the all the NMOS (A,B,C,D,E,F,G,H) recover the initial VT condition ($VT_0$), applying all the WLs to a negative WL voltage (NWLL) of −1V globally in the entire array. BLDEC holds all the BLs and SL (or MSLN) at VDD used in Standby. Because all the BLs and SLs are kept at VDD (1V), −2 V is applied to all the NMOS concurrently, resulting in untrapping the charge ($e^-$) from all the NMOS of the entire array simultaneously.

eMTPROM requires controlling the bitline condition that satisfies each mode, wherein the bitline circuits (330 BLDEC and 340 SA, in FIG. 3) act in an important role. A key aspect of the embodiment resides in controlling the bitline driver strength (in 330 BLDEC, in FIG. 3) depending on the mode such that the bitline is strongly driven to GND in the Programming mode, and weakly driving to GND when in Read mode.

FIG. 9 describes an essential aspect of embodiments of the invention. Each column of eMTPROM 900 consists of a plurality of cell (900), each having two NMOS (901*t* and 901*c*) for serving a data bit, where the left side NMOS is coupled to the bitline true (BLt), and the right side of the NMOS (901*c*) coupled to the bitline (BLc), as shown. BLt and BLc are controlled by the bitline driver (902*t*) in true side, and the bitline driver (902*c*) in the complement side, respectively. Each bitline driver (902*t* or 902*c*) consists of precharge devices (928*t* or 928*c*) and mode dependent pull down circuits (901*t* or 901*c*). During Standby state, BLt and BLc are precharged at VBLH (1V) by PMOS 928*t* and 928*c*, and all WLs are 0V. When Programming the column, a wordline (WL) goes high (EWLH=2V), and either BLt or BLc are strongly discharged, as described. A writing bit is given by signal DI, writing 1 (or DI=1), the mode-dependent pull-down circuit (901*t*) pulls down BLt with a first strength. For writing 0 (or DI=0), the mode-dependent pull-down circuit (901*t*) pulls down BLc with a first strength. This allows trapping the charge either 901*t* or 901*c* of the selected cell (901). When in Read mode, the mode-dependent pull-down circuit (901*t* and 901*c*) coupled to all BLt and BLc discharge the BLs with a second strength, where the second strength is significantly less than the first strength. Enabling signal PRGE increases the strength for the pull down device, while enabling the signal RE reduces the strength. Accordingly, this allows the cell to effectively trap the charge in the Programming mode while improving the signal development while in the Read mode. A detailed embodiment for the mode-dependent pull down circuit will be described hereinafter.

Figure 9A:
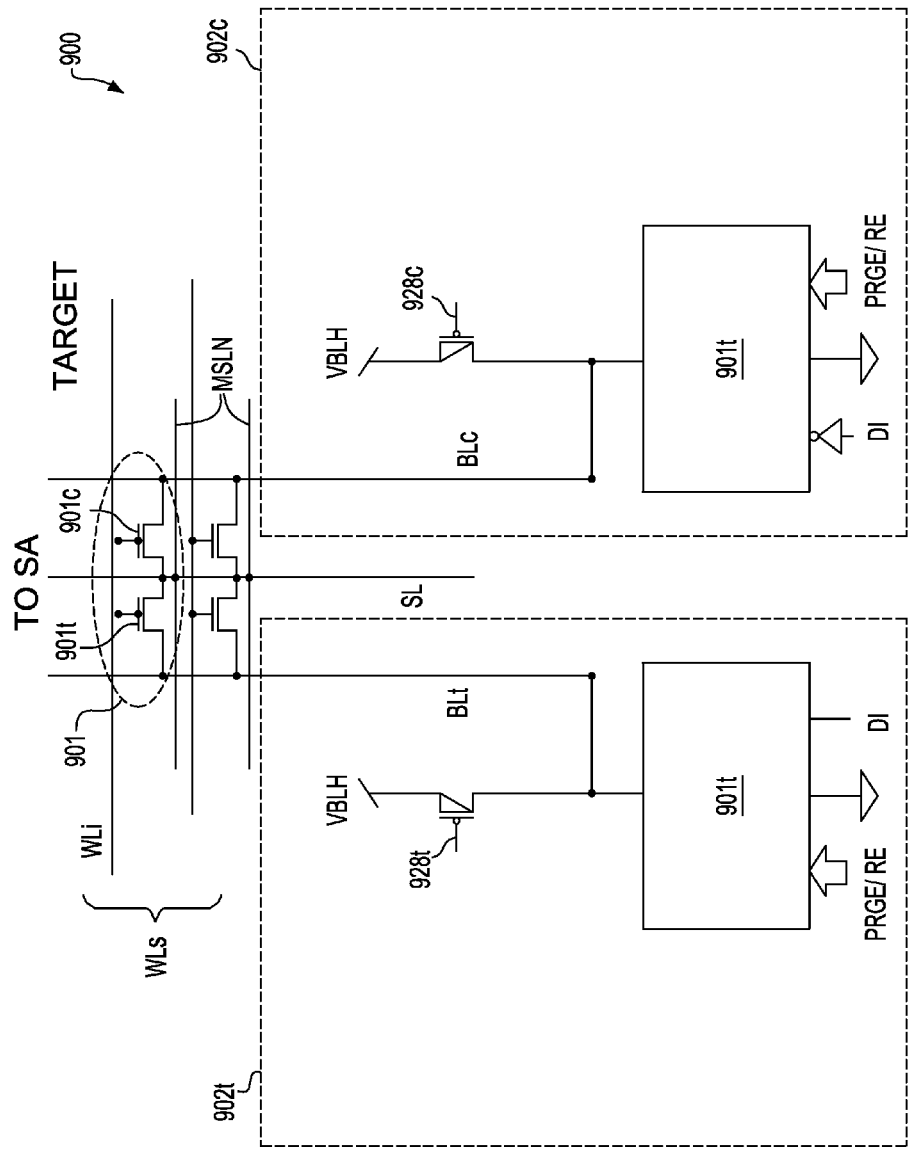
FIG. 9A illustrates bitline circuits (902t AND 902c) controlling a true bitline (BLt) and a complement bitline (BLc) for mode-dependent operations.

FIG. 9A shows a first embodiment 900, where details of the bitline decoder block 330 of FIG. 3 will be described. Each column of the block 330 consists of a bitline true driver 902*t* coupled to bitline true (BLt) and a bitline complement driver 902*c* coupled to bitline complement (BLc). Drivers 902*t* and 902*c* are used for Programming the corresponding side of the two NMOS (901*t* and 901*c*) in the memory cell (901). For simplicity, the following discussion eliminates the prefix of 't' and 'c' from the numbers (i.e. 902 referring to either 902*c* or 902*c*) if both drivers operating are the same, and use the prefix 't' and 'c' only when the operation is different.

Each of the driver 902 consists of two series PMOS 926 and PMOS 928 coupled to the bitline high voltage (VBLH) and the bitline (BL); NMOS 924 coupled to BL; node N916; and two parallel NMOSs (920 and 922) coupled to node 916 and GND, where the PMOS 928 is a bitline pull-up device, NMOS 920 and NMOS 922 are mode dependent to the pull-down circuit (901). More specifically, NMOS 920 is a large pull down device for Programming, and NMOS 922 is a small pull down device for the Read mode, respectively. PMOS 926 is a protection device for PMOS 928, and NMOS 924 is a protection device for NMOS 920 and 922. The control circuit with voltage level shifter circuit 904 (described hereinafter) generates pull-up enable signal S910 for PMOS 928; the first pull-down enables signal S912 for NMOS 920; and second pull-down signal S914 for NMOS 922. The signal 910 swings from VBLH to approximately (VBLH−VBLH_PR) to turn on PMOS (928). The signals 912 and 914 swing from 0 to VDD to turn on the corresponding NMOSs (920 or 922). Circuit 904 is controlled by the column-pre-decoded signal (YP012) for column selection as a decoder. The Program-Enable signal (PRGE) is activated or goes high when the Program mode is enabled, and Read Enable signal (RE) is activated or goes high when the Read mode is enabled. Circuit 902 in the true driver 902*t* and complement driver 902*c* are also controlled by DI and inverted DI for programming 1 (DI=1) or 0 (DI=0), respectively. The protection voltage VBLH_PR is (VBLH−1V) is used as a target.

Figure 9B:
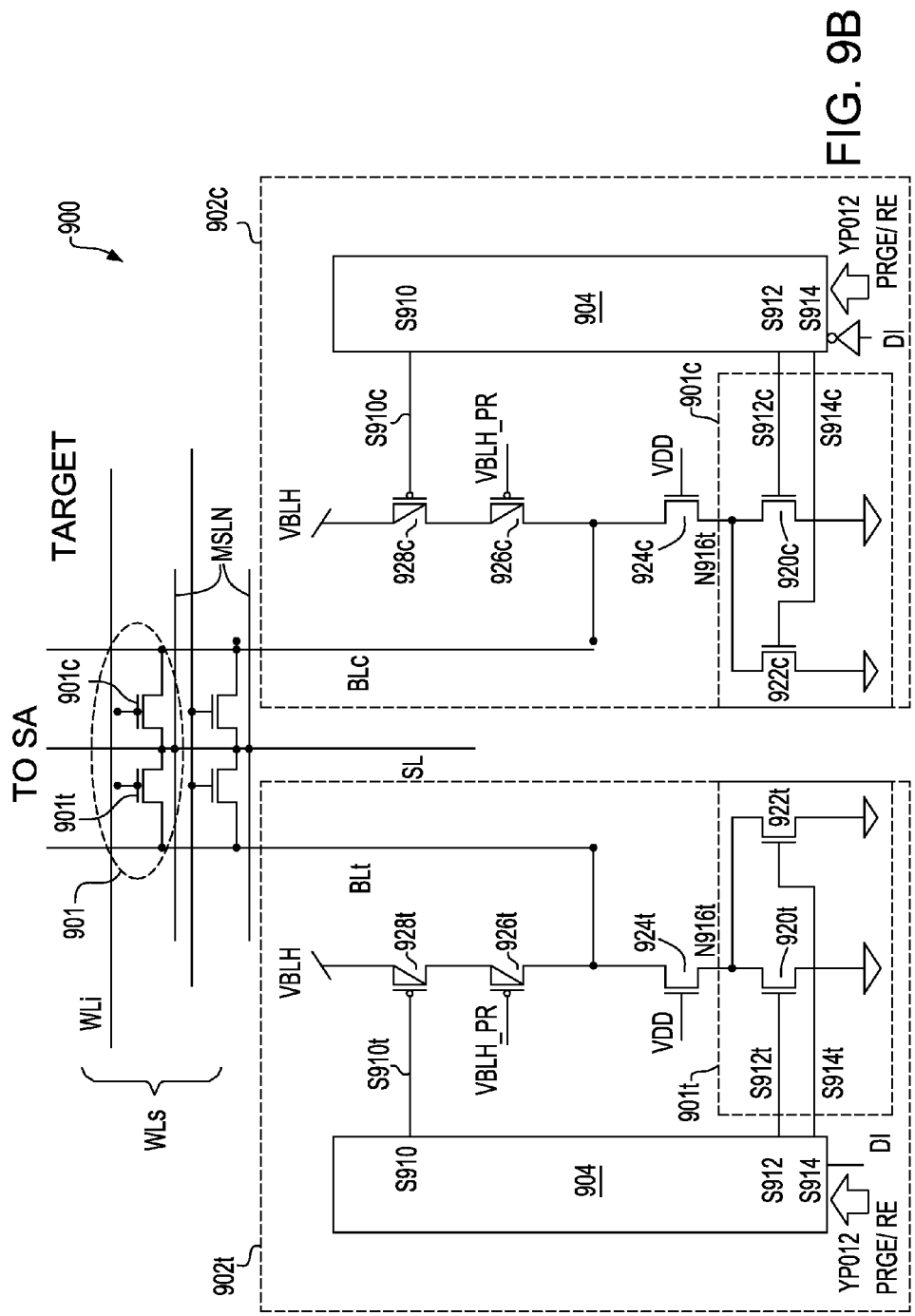
FIG. 9B illustrates an embodiment of the detailed bitline circuits (902t and 902c), wherein the NMOS (922c) has a same strength for pulling down the BLc as the NMOS (922t) for pulling down the BLt.
Figure 9C:
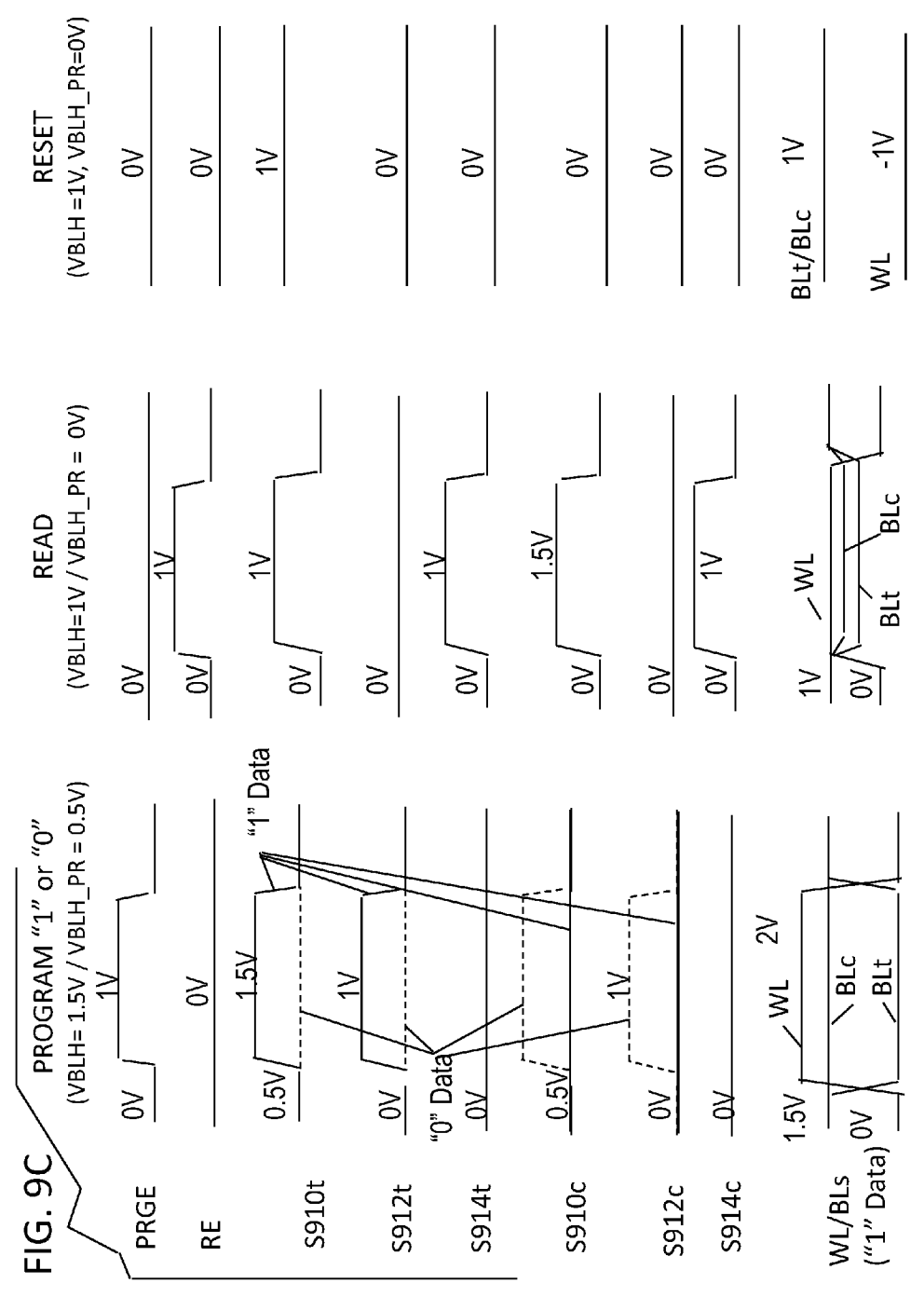
Figure 9D:
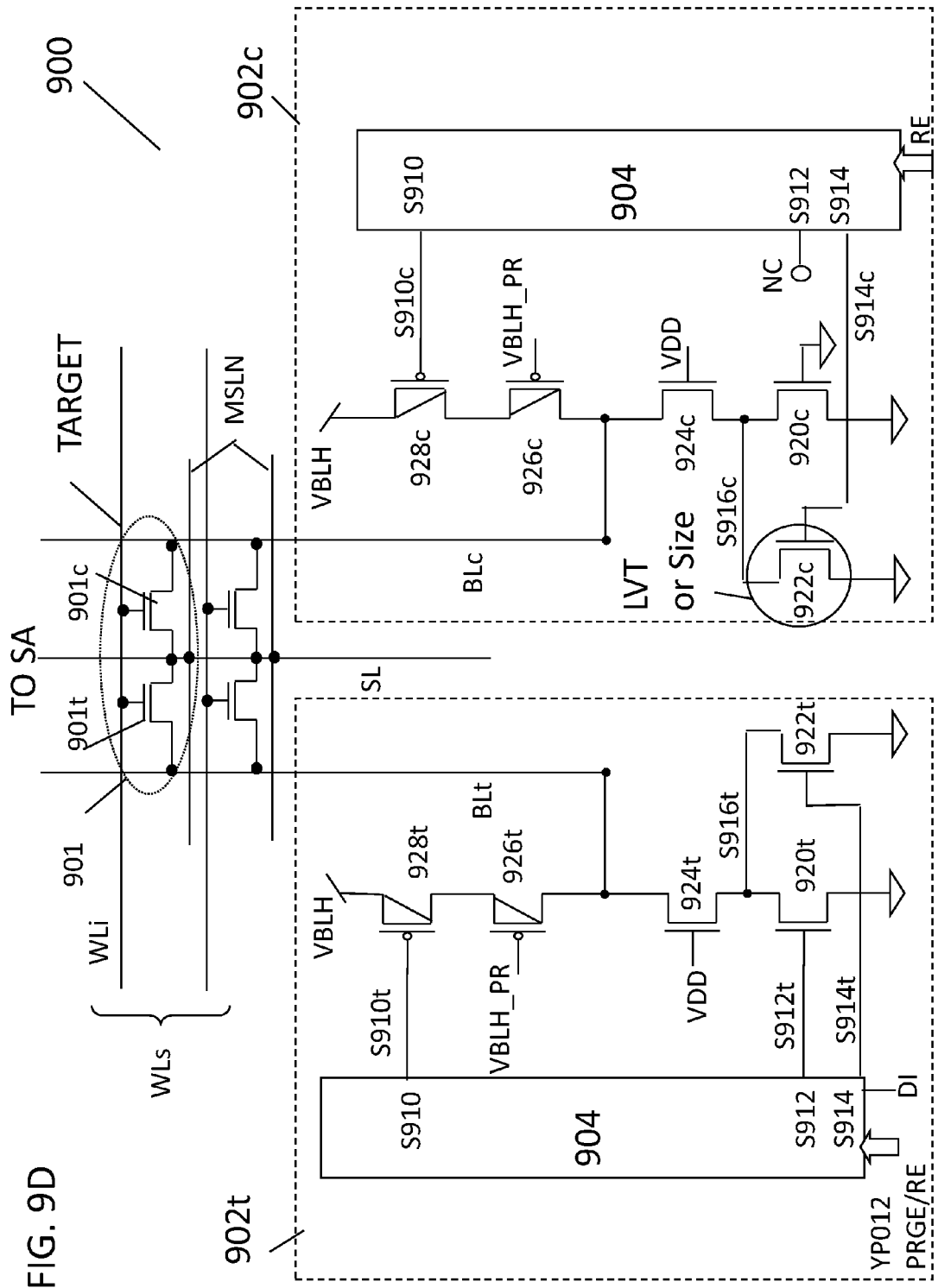
FIG. 9D illustrates an embodiment of the detailed bitline circuits (902t and 902c), where the NMOS (922c) has a slightly stronger strength for pulling-down the BLc than the NMOS (922t) for pulling down the BLt.

A detailed operation will be described hereinafter with the timing diagram illustrated in FIG. 9B.

In a Standby state, signals PRGE and RE are both low (0V), turning signal S910 low (VBLH_PR=VBLH−1V, which is 0V because VBLH=1V), and turning signal S912 and S914 low (0V or GND). PMOS 928 is on and NMOSs 920 and 922 are off, resulting in precharging BL to VBLH (1V).

When Programming mode is enabled, signal PRGE goes high (1V or VDD). Prior to this operation, VBLH is raised from 1V to the elevated bitline voltage (EBLH=1.5V), which results in raising the VBLH_PR from 0V to 0.5V. Signal YP012 selects 8 out of 64 columns using address 0, 1, 2 with high state (1V). Assuming that signal Y012 is high, high-going PRGE turns the signal S910*t* high (1.5V), and signal S912*t* high (1V or VDD) for the true driver 902*t* if DI is high (DI=1). The signal S914*t* is low, disabling the small pull-down NMOS 922*t*. As a result, the large NMOS 920*t* turns on, strongly discharging BLt. On an alternative complement side, signals S910*c* and S912*c*, and S914*t* remain in Standby mode, keeping BLc high. If DI is low (DI=0), high-going PRGE turns the signal S910*c* high (1.5V), and the signal S912*c* high (1V or VDD) for the complement driver 902*c*. The signal S914*c* is low, disabling the small pull-down NMOS 922*c*. This results in having the large NMOS 902*c* on, strongly discharging BLc. On the true side, signals S910*t* and S912*t*, and S914*t* remain in Standby mode, keeping BLt high. When WL rises to 2V, either one of the two NMOS (901*t* or 901*c*) on the target cell strongly turns on, while disabling others when the corresponding WL (WLi) goes high, trapping the charge only one of the pair of NMOS (901*t*, 901*c*).

Programming is not enabled for the unselected column (YP012 is low), resulting in an 8 out of 64 parallel write.

It is to be noted that the gate of PMOS 926 is coupled to the voltage source of bitline protection (VBLH_PR) protecting PMOS 928 when in Programming mode because the maximum source and gate voltage $V_{SD}$ are 0.5V when turned on, and the maximum source and drain voltage $V_{SD}$ stand at 1V when turned off because of the PMOS 926 behavior. The gate of NMOS 924 is coupled to the voltage source of the bitline protection (1V, VDD) that protects NMOS 920 and 922 during Programming as a result of the maximum source voltage $V_{GS}$ being at 1V when turned on, and the maximum drain and source voltage $V_{DS}$ being 1V when turned off because of the NMOS 924 behavior. PMOS 926 and NMOS 924 can be left optional, and be removed if not necessary.

For a Read mode, signal RE goes high making signal 910*t*, 914*t*, 901*c*, and 914*c* go high. This results in turning off PMOS 928*t* and 928*c*, turning on small NMOS 922*t* and NMOS 922*c*, weakly discharging the BLt and BLc. The BL voltage is determined by the charge trap state in the two NMOS (901*t* and 901*c*) being activated by WL. The differential voltage developed on the BL pair is sensed by a sense amplifier (340 in FIG. 3).

When in Reset mode, the BL condition and corresponding control are the same as when in the Standby state. Instead, the WL is lowered to −1V, as previously described.

FIG. 9C shows a second embodiment, where the structure is exactly the same as the first embodiment excepting for the use a lower threshold voltage only for NMOS 922c than NMOS 922t. The gate of the 902c is tied down to GND, because it is not used. Alternatively, NMOS 922 VT can be the same as NMOS 922c although the device size of NMOS 922c can be greater than NMOS 922t. This modification allows to eliminate the necessity to trap the charge to the complement NMOS (901c) writing 0. Instead, NMOS 901c is used only for reference. The non-trapping state of 901t is 0, and the trapping state is 1, wherein details thereof are described using the timing diagram illustrated in FIG. 9D.

Programming 1 state is precisely the same as in the first embodiment. The Read mode operation is also similar to the first embodiment; however, the BLc swings between BLt having a 0 state and BLc having a 1 state. This is because of the VT of 922c is lower than that of NMOS 922t, resulting in a somewhat strong discharge of BLc over BLt. When 1 is Programmed, BLt is discharged more than BLc as long as for the NMOS 901c trap, the charge increases VT than the complement BL discharge voltage.

Figure 9F:
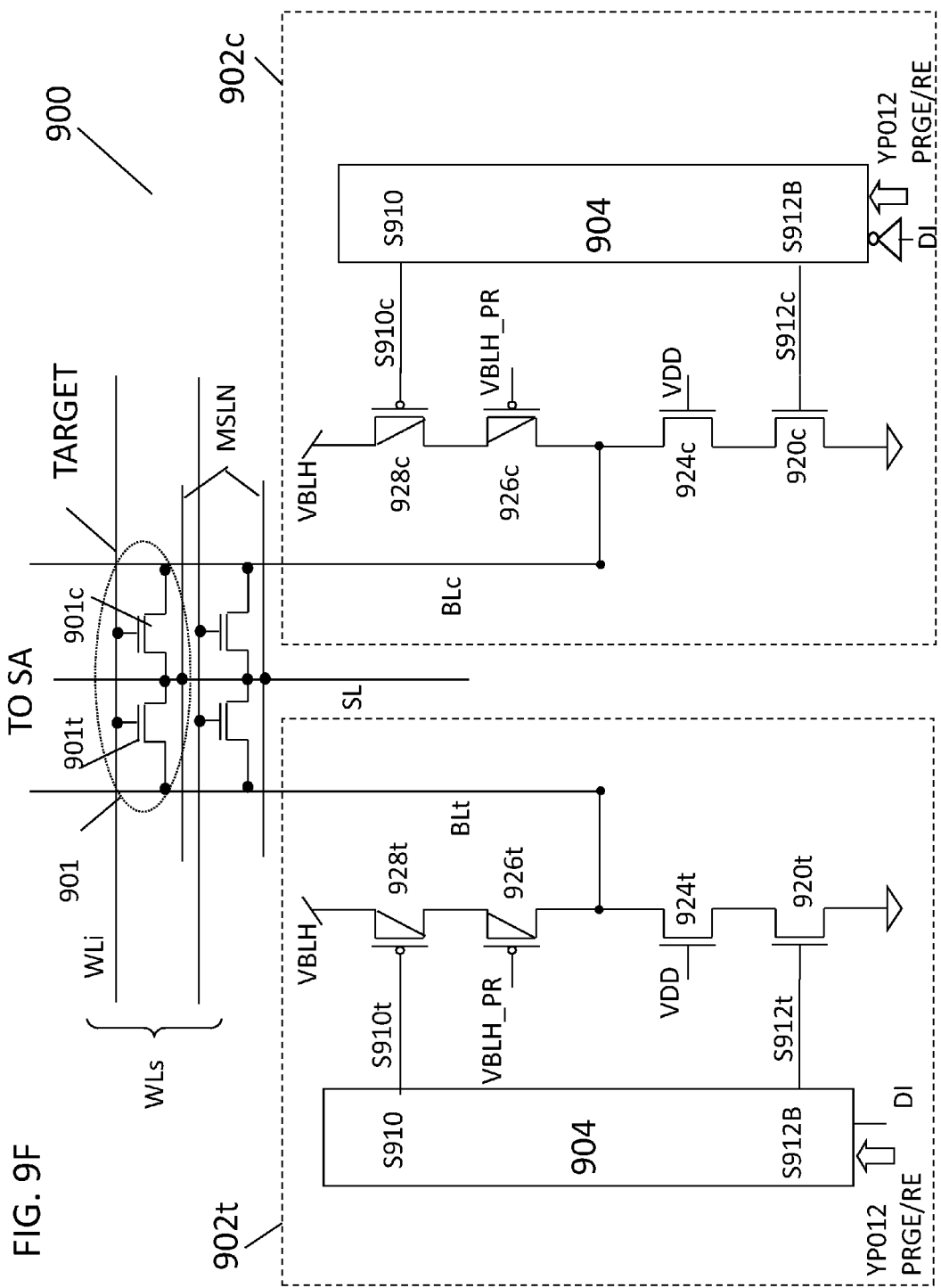
FIG. 9F illustrates an embodiment of the detailed bitline circuits (902t and 902c), where a single mode dependent NMOS (920t or 920c) controls the corresponding bitline (BLt or BLc).

FIG. 9E shows a third embodiment that uses only a single large NMOS 920. The mode-dependent pull-down is enabled by changing the control process for the signal S912 when in Programming and Read modes. FIG. 9F shows a timing diagram where the operation in Programming and Reset modes is exactly the same as in the aforementioned first embodiment.

The Read model disables PMOS 928t and 928c. It also turns signals 912t and 912c high, which strongly discharges BLt and BLc. Then 912t and 912c go low, turning off the BLs. BLt and BLc therefore go high through activated NMOS 901t and 901c, but eventually become saturated in view of the threshold voltages of NMOS 901t and 901C. This results in generating a differential voltage determined by the charge trap state of one of the two NMOS.

Figure 9H:
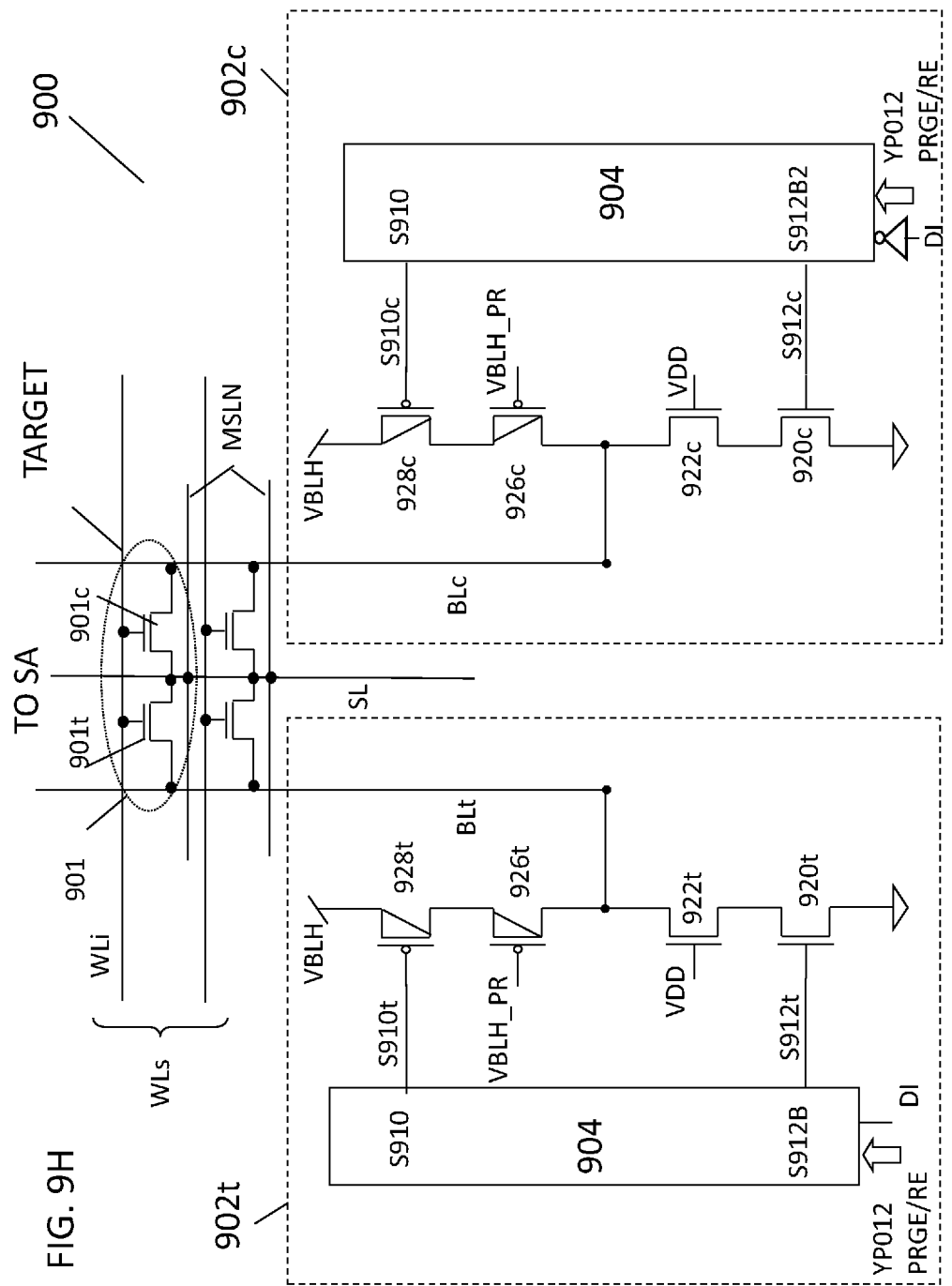
FIG. 9H illustrates an embodiment of the detailed bitline circuits (902t and 902c), where a single mode dependent NMOS (920t or 920c) controls the corresponding bitline (BLt or BLc) in a different manner.

FIG. 9G and FIG. 9H show a fourth embodiment and corresponding timing diagrams, the structure of which is the same as the third embodiment, except for the control method of 904 of ports 912B and 912B2. This results in increasing the period of 912c that is longer than 912t during Read mode, because NMOS 920c is turned on longer than 920t. Therefore, the transition of BLt starts earlier than BLc. By adjusting the timing of setting, the sense amplifier (SA in FIG. 3) is shown in FIG. 9H, the sense amplifier can detect a non-trapped state of the NMOS 901t as a data bit of 0 and a trapped state of the NMOS 901t as a data bit of 1, respectively. Thus this eliminates a necessity to program complement NMOS (901c).

Figure 9J:
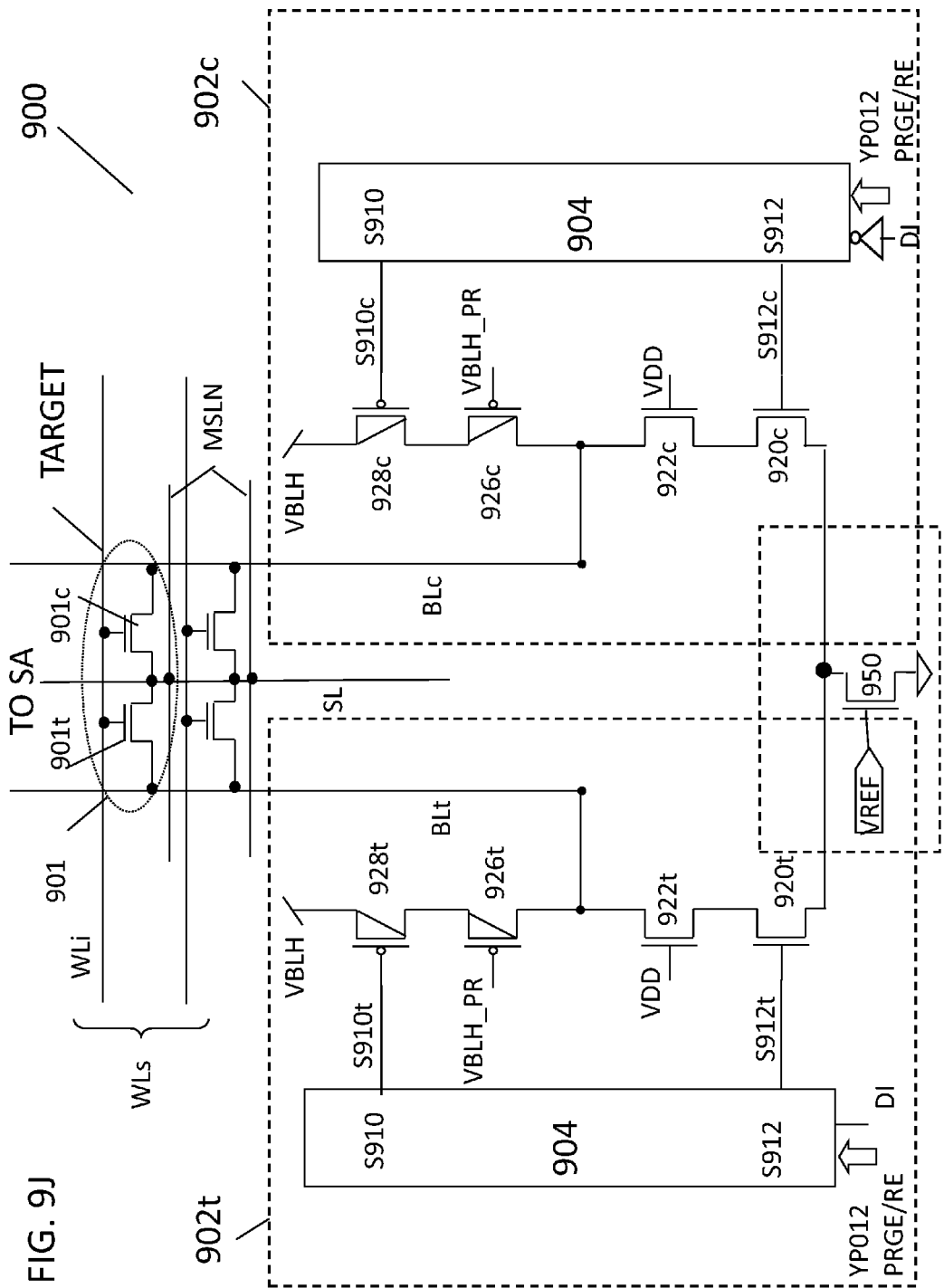
FIG. 9J illustrates an embodiment of the detailed bitline circuits (902t and 902c), where a single mode-dependent current source device (950) controls the pull down strength for both bitlines (BLt or BLc).

FIG. 9I and FIG. 9J show a fifth preferred embodiment and its timing diagram, the structure of which is the same as the third embodiment, except having one more NMOS 950 as a mode-dependent current source adjustment. Unlike the third embodiment, the signals 912t and 912c turn on when RE is high. Instead, the VREF voltage in Programming mode is significantly higher (1.5 v) than other mode (0.5V). This results in emulating a strong device only for Programming mode.

Figure 9L:
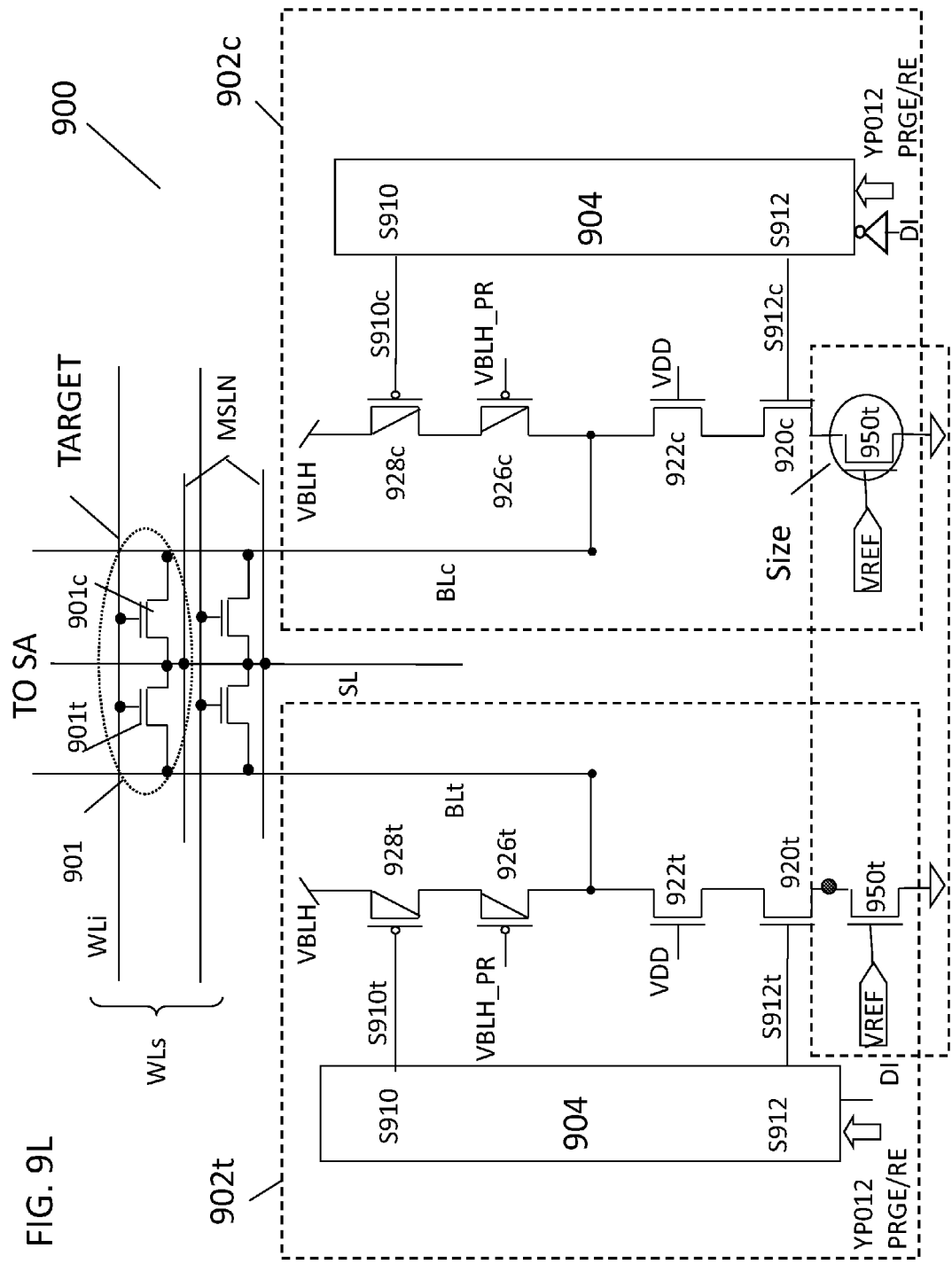
FIG. 9L illustrates the fifth preferred embodiment of the detailed bitline circuits (902t and 902c), where mode-dependent current source devices (950t and 950c) control the pull down strength for the corresponding bitline (BLt and BLc) independently.

FIGS. 9K and 9L show a sixth embodiment and timing diagram, the structure of which is the same as the fifth embodiment, except for splitting the current source into NMOS 950t and NMOS 950c where the threshold voltage of 950c is lower than NMOS 950t when VREF2 is equal to VREF. Alternatively, VREF2 (0.6V), which is somewhat higher than the VREF condition (0.5V) can be used for NMOS 950c using the same threshold voltage as NMOS 950c. VREF 2 keeps this voltage regardless of Read or Write. However VREF voltage is mode dependent voltage (i.e., 1.5V when Programming, and 0.5V for the others) i.e., the same as in the fifth embodiment. For the Read mode, the BLc pull-down is somewhat stronger than BLc because of the lower threshold of the NMOS 950t or higher VREF2 than VREF. BLt goes low more than BLc for a non-trapped cell. When NMOS 901c traps the charge, BLt is higher than BLc, allowing a 0 and 1 read.

Figure 10:
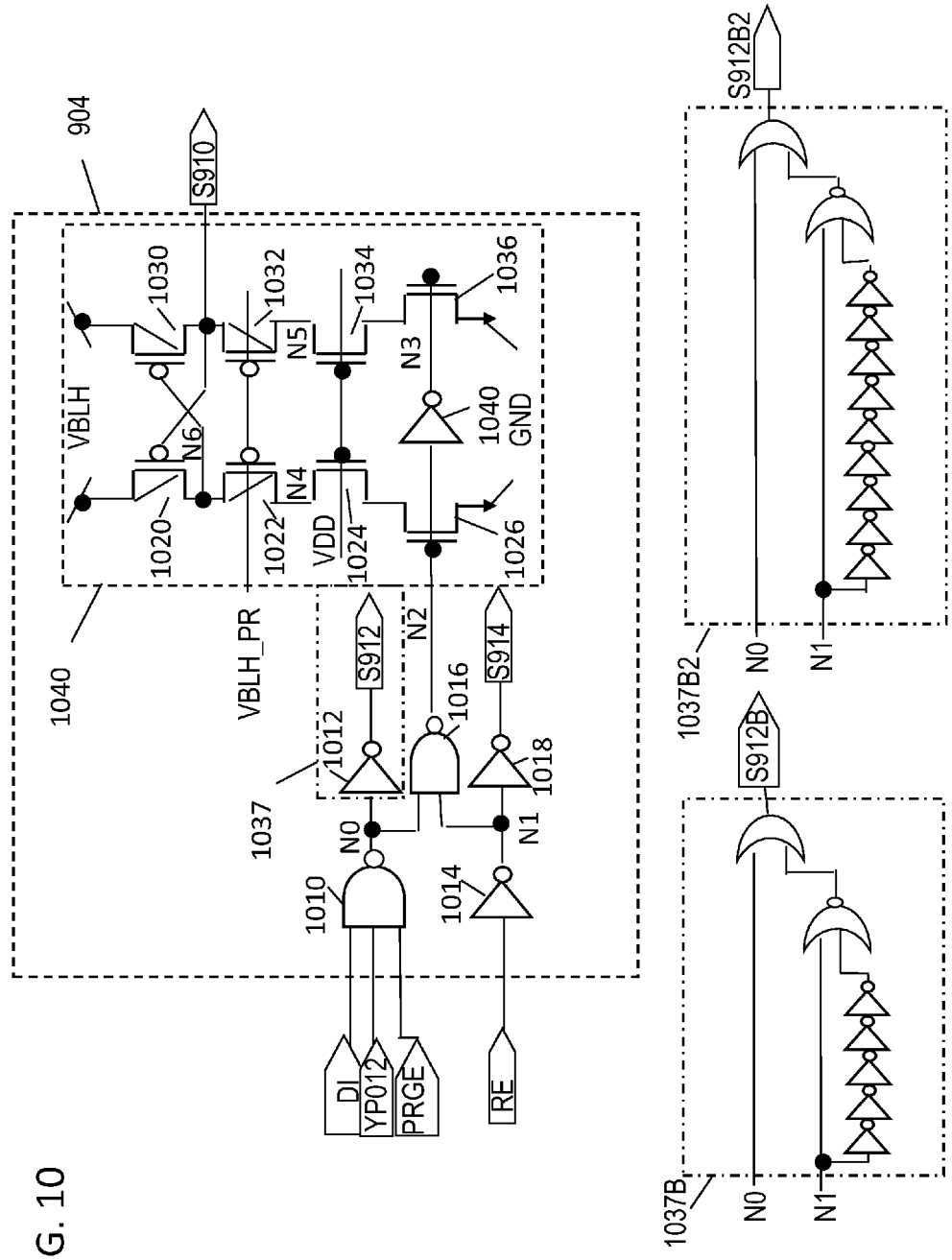
FIG. 10 shows detailed circuit 904 used in FIG. 9A.

FIG. 10 shows a detailed circuit 904 using FIGS. 9A to 9C, 9E, 9G, 9I, and 9K. The data input DI, pre-decoded signal YP012, and Program enable signal (PRGE) are coupled to NAND 1010, turning node N0 low and output 912 high when the signal PRGE goes high if DI and YP012 remain high. This allows discharging the corresponding greater NMOS for discharging BL, as described previously. When in Read mode, RE goes high, which turns node N1 low and the signal 914 high, turning on a small pull-down NMOSs. The inverter 1012 as S912 driver 1037 is replaced by a pulsed driver 1037B for both the true and the complement side of the third and fourth embodiments, and the true side of fourth embodiment, and 1037B2 for the complement side of fourth embodiment, where 1037B generates a longer pulse than 1037 because of more inverter chains. N0 and N1 are coupled to NAND 1016, turning the node N2 high when read or write is enabled. N2 is the level shifted by level shifter 1040 having PMOSs 1020, POMS 1022 and NMOS 1024 and NMOS 1026 serially coupled from VBLH to GND, and PMOSs 1030, POMS 1032 and NMOS 1034 and NMOS 1036 serially coupled from VBLH to GND, and inverter 1040. PMOS 1020 and PMOS 1030 are cross-coupled to latch node N6 and output S910 high state. Prior to enabling RE or PRGE, node N2 is at low, turning on N3, and making the output S910 low such that BL is precharged through the BL driver (902). High-going N2 (when the PRGE or RE goes high) turning on NMOS 102, making the node N6 low that results in driving S910 to high (VBLH). The gate of NMOS 1024 and NMO1034 are coupled to VDD, protecting the NMOS 1026 and NMOS 1036 during Programming mode. Similarly, the gate of PMOS 1022 and PMO 1032 are coupled to VBLH_PR, protecting the PMOS 1020 and PMOS 1030 when in Programming mode.

Figure 11:
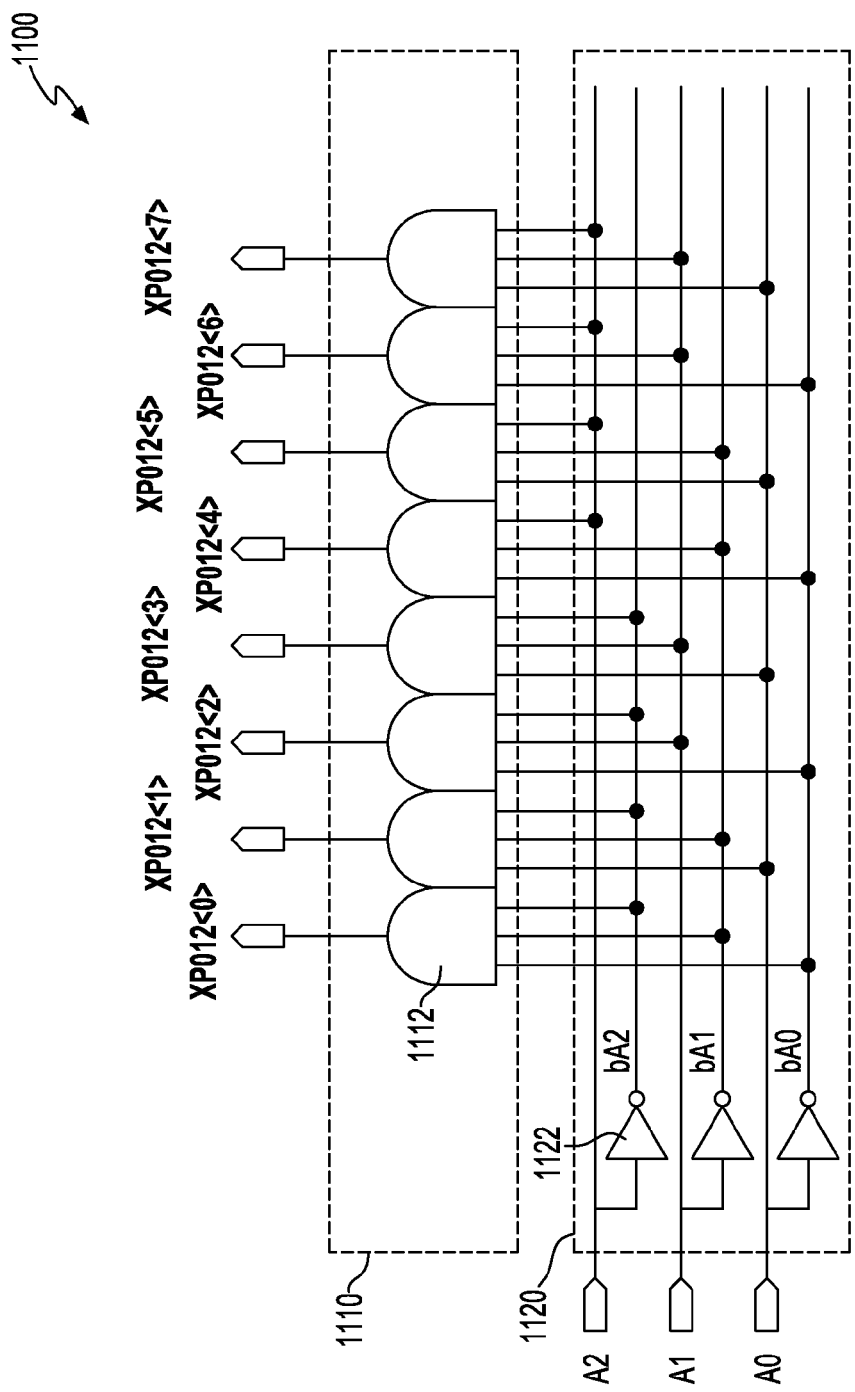
FIG. 11 shows generator YP012 that generates pre-decoded signals (YP012<0:7>) coupled to circuit 904 in FIGS. 9A to 9C, 9E, 9G, 9I, and 9K.

Referring the FIG. 11, generator YP012 creates predecoded signals (i.e. YP012<0:7>) coupled to circuit 904 in FIGS. 9A to 9C, 9E, 9G, 9I, and 9K consisting of a pre-decoder (1110) having a plurality of 3-way AND logic (1112). Each 3-way AND logic couples to the corresponding address bus (1120). The address bus (1120) includes an inverted signal for each corresponding address (1122)—preferably manually.

Figure 12:
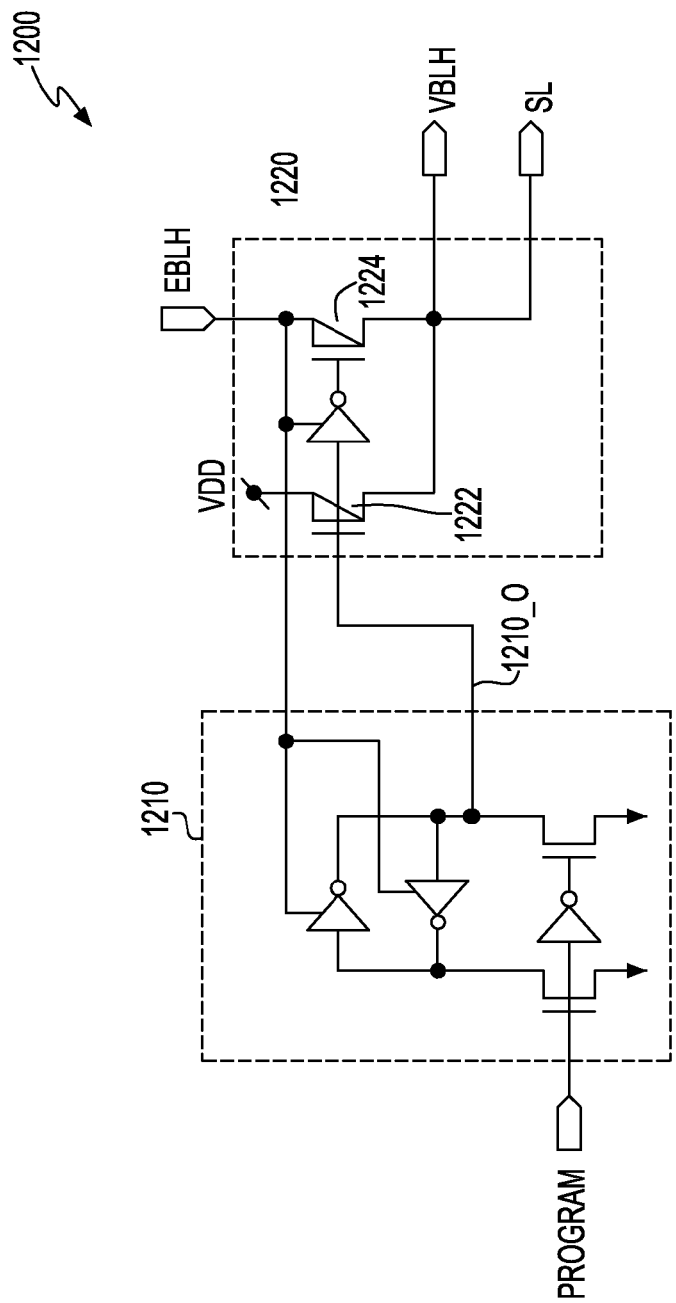
FIG. 12 illustrates bitline voltage selector (1200) consisting of VBLH switch (1220) coupled to a level-shifter (1210) controlled by mode selection signal PROGRAM.

Referring to FIG. 12, bitline voltage selector (1200) consists of VBLH switch (1220) coupled to level-shifter (1210) controlled by mode selection signal PROGRAM. As long as the signal PROGRAM is low, the node 1210_O is low, resulting in turning the PMOS 1222 on and PMOS 1220 off, coupled to VBLH at VDD. When the Program mode is enabled, the signal PROGRAM goes high, turning the node 1210_O high, turning PMOS 1224 on and PMOS 1222 off, coupled VBLH to an elevated bitline voltage (EBLH=1.5V).

Figure 13:
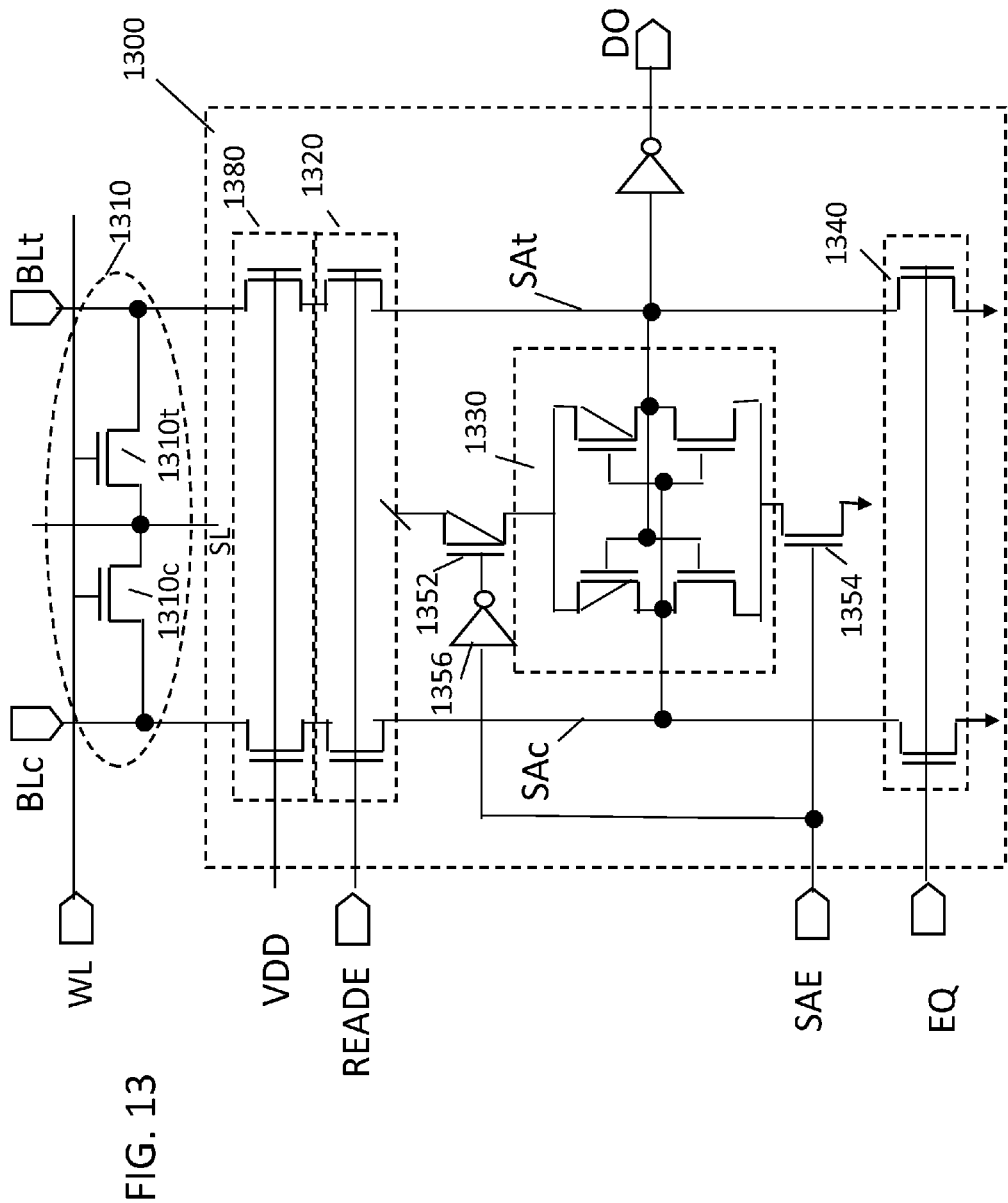
FIG. 13 shows a sense amplifier in each column consisting of a CMOS cross-coupled sense amplifier (1300); a cross-coupled sense amplifier (1330) controlled by bitline equalizer (1340); a sense enable signal (SAE) coupled to NMOS 1354; and a PMOS (1352) with inverter (1356) to invert the SAE signal.

Sense amplifier block (340 in FIG. 3) consists of 64 sense amplifiers (SA). Referring to FIGS. 13 and 14, a sense amplifier in each column consists of CMOS cross-coupled sense amplifier (1330). The cross-coupled sense amplifier (1330) is controlled by bitline equalizer (1340), the sense enable signal (SAE) coupled to NMOS 1354, and PMOS (1352) with inverter (1356) to invert the SAE signal. The cross-coupled nodes (SAt and Sac) are coupled to the bitline pair (BLt and BLc) by way of the read enable multiplexer (1320) and through the protection NMOSs (1380).

Prior to enabling the sense amplifier, nodes SAt and SAc are precharged at GND by the equalizer (1340). When a read common is given, the signal EQ goes low, disabling the equalizer (1340). Concurrently, the signal READE goes high that couples BL to SA through protection devices 1380 and column switches 1320, waiting for WL activation. The gate of the protection NMOS (1380) is coupled to VDD, protecting the devices in sense amplifier from the elevated BL voltage (EBLH=1.5V) during Read mode.

When WL turns on the NMOS cells (1310c and 1310t), the BL voltage is developed, as described previously. After developing a sufficient differential signal on the bitline par, the signal SAE goes high, activating CMOS cross coupled sense amplifier (1330), thus making SAt and SAc low and high, respectively or vise-versa. The output DO therefore follows the state of the sensed result (high for 1, or low for 0).

The embodiments described thus far employ two NMOS devices for storage. Finally, FIG. 15-1 uses a single NMOS serving as a storage element, doubling the memory cell density. Embodiment 1500 includes top array 1500TOP and bottom array 1500BOTTOM. The sense amplifier block (1500SA) is arranged between two arrays. Each column of SA 1502 is coupled to BL true (BLt) for the top array 1500TOP, and BL complement (BLc) for the bottom array 1500BOTTOM, resulting in an open-BL architecture (10).

The bitline driver circuits (or bitline decoder) (1510) are arranged on the top of top array, and the bottom of the bottom array. The bitline driver structure is the same as in the first embodiment except having one more additional NMOS 1522REF and its respective control. More specifically, bitline driver 1510 coupled to each of the BLs includes PMOS 1528, 1526, and NMOS 1522, and further NMOS 1520, NMOS 1522, and NMOS 1522REF, which are controlled by circuit block 1502. A key object is to use two small devices 1522 and 1522REF, where the 152REF is somewhat stronger than 1522. The device 1522REF can be designed using a lower threshold than the other device, or a somewhat greater device size. This allows using one array is reference for another array using the reference wordline (WL).

Figure 15A:
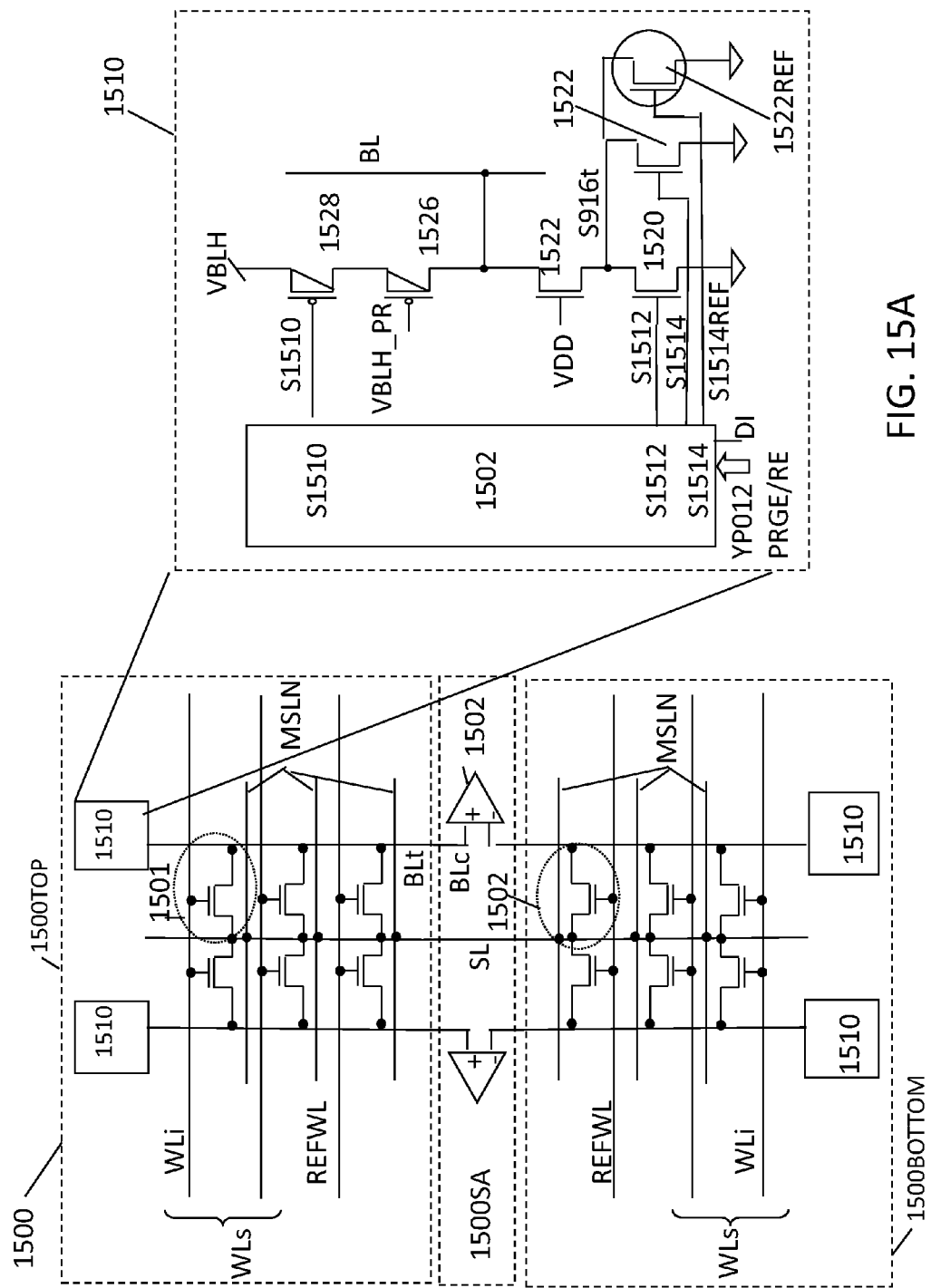

The detailed operation is described now with the timing diagram shown in FIG. 15-2. In a Standby state, the signals PRGE and RE (not shown in the timing diagram) are both low (0V), which makes the signal S1510 low (VBLH_PR=VBLH−1V, which is 0V because VBLH=1V), and the signal S1512 low (0V or GND), and signal S1514 low. PMOS 1528 is on and NMOSs 1520 and 1522, 1522REF are off, resulting in precharging the BL to VBLH (1V) for both arrays.

Programming mode for the corresponding array is enabled when the signal PRGE goes high (1V or VDD). Prior to this operation, the VBLH is raised from 1V to an elevated bitline voltage (EBLH=1.5V), which results in raising the VBLH_PR from 0V to 0.5V. Signal YP012 selects 8 out of 64 columns using address 0, 1, 2 with high state (1V). Assuming the signal Y012 is high, the high-going PRGE makes the signal S1510 low (0.5V), and the signal S1512 low (0V or GND) if DI is 1. The signal 1514 and 1514REF remains low. This turns PMOS 1528 off and the large NMOS 1520 on, strongly discharging the BL. Consequently, when the WL is raised to 2V, the NMOS (1501) on the target cell strongly turns on while disabling others when the corresponding WL (WLi) goes high, trapping the charge to the NMOS. Note that the Programming enables only trapping the charge, creating 1 state. Non-trapped cell is at 0 state which does not require Programming.

Write mode may be enabled only one of the top or bottom array as shown in the timing diagram. Alternatively, write mode can be enabled for both top and bottom arrays concurrently, because the operation of the top array is totally independent from one another.

For a Read mode, a wordline (WL) in one of the top or bottom array (i.e., 1500TOP) is activated, while activating reference wordline (REFWL) in the other array (i.e. 1500BOTTOM). Then read enables (RE) goes high form both arrays at the same time, This makes the signal 1510, 1514 in one array (e.g., top) and the signals 1510 and 1514REF in the other array (e.g., bottom) go high. This results in turning off PMOS 1528, turning on NMOS 1522 in the activated array, and NMOS 1522REF for the reference array. Since 1522REF uses a somewhat stronger device than device 1522, BL (i.e. BLc) in the reference array (i.e. bottom) is discharged more than BL (i.e. BLt) in the activated array (i.e. top) for reading 0. For a reading of 1, BL in the activate array is discharged more than BL in the reference array because of the charge trapped state of the activated cell. The differential voltage developed on the BL pair using top and bottom array is sensed by sense amplifier (340 in FIG. 3).

For a Reset mode, the BL condition and their corresponding control are the same as the Standby state. Instead, the WL is lowered to −1V, as described previously.

Figure 16:
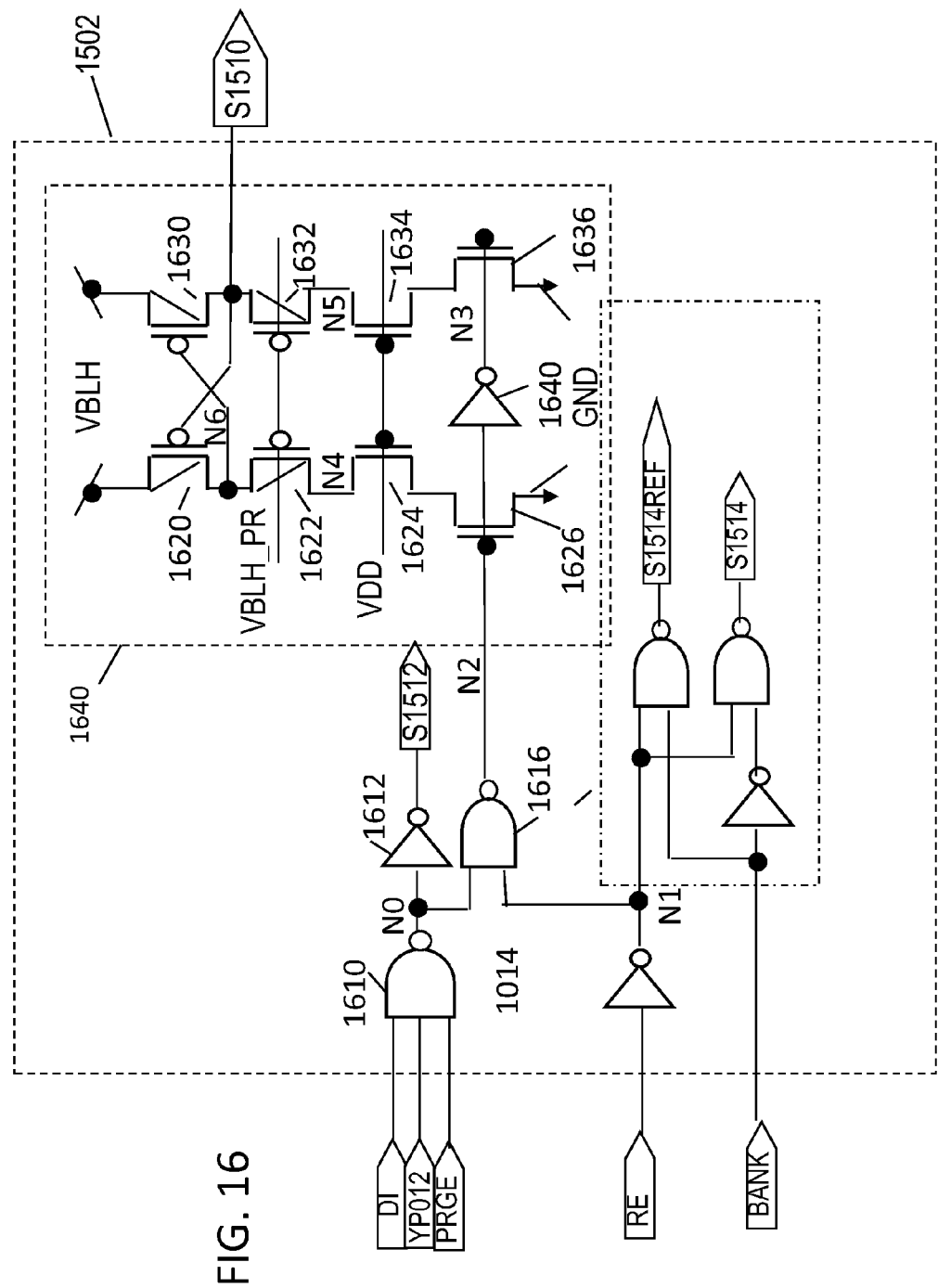
FIG. 16 shows a detailed circuit in the block (1502) as shown in FIG. 15-1.

FIG. 16 shows a detailed circuit 1502. The data input DI and pre-decoded signal YP012, and Program enable signal (PRGE) coupled to NAND 1610 turns node NO low and the output 1512 high when PRGE goes high if DI and YP012 are high. This allows discharging the corresponding large NMOS (1520) for discharging the BL, as described previously. For a Read mode, RE goes high, which makes node N1 low and makes the signal 1514 if the array is selected for activation (BANK=1). If the array is not selected (BANK=0), signal 1514REF goes high. This results in activating the corresponding NMOS 1522 and 1522REF depending the array selection using signal BANK.

N0 and N1 are coupled to NAND 1616 making node N2 high when Read or Write is enabling. N2 is level shifted by the level shifter 1640 having PMOSs 1620, POMS 1622 and NMOS 1624 and NMOS 1626 serially coupled from VBLH to GND, and PMOSs 1630, POMS 1632 and NMOS 1634 and NMOS 1636 serially coupled from VBLH to GND, and inverter 1040. PMOS 1620 and 1630 is cross-coupled to latch the node N6 and output S1510 high state.

Prior to enabling RE or PRGE, node N2 is low, turning on N3, and turning the output S1510 low (VBLH_PR) such that BL is precharged through the BL driver (1510). High-going N2 (when the PRGE or RE goes high) turns on the NMOS 1626, making node N6 low, resulting in driving S1510 to high (VBLH). The gate of NMOS 1624 and NMO1634 are coupled to VDD, protecting NMOS 1626 and NMOS 1636 during Programming. Similarly, the gate of PMOS 1632 and PMOS 1634 are coupled to VBLH_PR (=VBLH−1V), protecting the PMOS 1620 and PMOS 1630 while in Programming mode.

While the present disclosure has been particularly shown and described with respect to preferred embodiments thereof, it will be understood by those skilled in the art that the foregoing and other changes in forms and details may be made without departing from the spirit and scope of the present disclosure. By way of example, certain embodiments may include protection NMOS and PMOS (e.g., 926t/c and 924t/c in FIGS. 9A to 9C, 9E, 9G, 9I, and 9K, which may be removed or shunted by way of short-circuiting the source and the drain of the removed protection NMOS and PMOS, if deemed unnecessary. It is intended that the present disclosure not be limited to the exact forms and details described and illustrated, but fall within the scope of the appended claims.

What is claimed is:

1. A bitline circuit controlling a charge trap comprises a MOSFET memory array coupled to a bitline and a source-line, wherein said bitline is mode-dependent pull-down circuit changes its circuit strength causing a greater current flow through said MOSFET memory array when coupled from said source-line to said bitline, activating said mode-dependent pull-down circuit when in Programming mode and limiting said current when in Read mode, said mode-dependent pull-down circuit comprising:
   a P-type MOS (PMOS) device having a source and drain coupled to a bitline high voltage (VBLH) and further connected to the bitline, and a first N-type MOS (NMOS) having said source and drain coupled to GROUND (GND), said drain connecting to said bitline, and a second NMOS having said source and drain coupled to GND and said drain further connected to said bitline, respectively, discharging said bitline to a first condition by turning on said first NMOS when in said Programming mode, and discharging to a second condition by turning on said second NMOS when in said Read mode,
   wherein said first NMOS device has a size greater than that of said second NMOS device.

2. The bitline circuit recited in claim 1 further comprises a first P-type MOS (PMOS) device having a source coupled to a bitline high voltage (VBLH), and a second PMOS device having said source, drain, and gate coupled to said drain of said first PMOS, and further connected to said bitline, and further to a bitline-protection voltage (VBLH_PR) that is smaller than said VBLH by a predetermined voltage, and said first PMOS is protected when said VBLH raises when in said Programming mode.

3. The bitline circuit recited in claim 2 further comprising a first and second N-type MOS whose respective source is coupled to GROUND (GND) and a third NMOS having said source, drain, and gate coupled to the respective drain of said first and second NMOS and further connected to said bitline, and further to a voltage source (VDD), respectively discharging said bitline to a first condition by turning on said first NMOS when in said Programming mode, and respectively discharging to a second condition by turning on said second NMOS when in said Read mode, thereby protecting said first and second NMOS when said VBLH rises when in said Programming mode.

4. The bitline circuit recited in claim 1, wherein said mode-dependent pull-down circuit comprises a P-type MOS (PMOS) having said source and drain coupled to a bitline VBLH and further connected to said bitline, and a N-type MOS (NMOS) having said source and drain coupled to GND and connected to said bitline, wherein said gate of said NMOS is controlled by said mode dependent pull-down circuit, discharging said bitline by turning on said NMOS when in said Programming mode, and periodically discharging by turning on said NMOS when in said Read mode.

5. The bitline circuit recited in claim 1, wherein said mode-dependent pull-down circuit comprises said P-type MOS (PMOS) whose source and drain is coupled to said bitline VBLH and said bitline, and a first N-type MOS (NMOS) whose drain is coupled to said bitline, and a second NMOS whose drain, source, and gate are coupled to said source of said first NMOS, GND and further connected to an analog voltage (VREF), said bitline discharging to said first condition by turning on said first NMOS using a higher VREF when in said Programming mode, and discharging to said second condition by turning on said first NMOS using a lower voltage of VREF when in said Read mode.

6. A bitline true and complement circuit controlling a charge trap comprising a MOSFET memory array coupled to a source-line true and either true or complement bitline, and a common source-line, wherein said bitline true and complement are coupled to a respective bitline true and complement, wherein each of said bitline circuits comprises a mode dependent pull-down circuit for discharging said respective bitline, wherein said mode-dependent pull-down circuit changes a circuit strength when in Programming mode followed by a Read mode, and wherein a greater current flows through the MOS coupled to true bitline and the activated wordline from the source-line to said true bitline by activated said pull-down circuit coupling to said true bitline when in said Programming mode, and limiting said current in said both true and complement bitlines when in said Read mode, each of said mode-dependent pull-down circuit comprising a PMOS having a source and drain coupled to a bitline high voltage (VBLH) and to said bitline, and a first NMOS having said source and drain coupled to GND and to said bitline, and a second NMOS having said source and drain coupled to GND and to said bitline, respectively, wherein said second NMOS in said complement circuit is stronger than that in said true circuit, wherein discharging said true bitline to said first condition turn on said first NMOS in said true circuit while in said Programming mode, and discharging said true bitline to said second condition by turning on said second NMOS in said true circuit and said complement bitline to a third condition by turning said second NMOS in said complement circuit when in said Read mode, and
   wherein said second NMOS device threshold in said complement circuit is lower than said second NMOS of said true circuit.

7. The bitline true and complement circuit recited in claim 6, wherein said second NMOS device size of said complement circuit is greater than said second NMOS of said true circuit.

8. The bitline true and complement circuit recited in claim 6, wherein each of said mode-dependent pull-down circuits comprises a PMOS having said source and drain coupled to said bitline high voltage (VBLH) and further connected to said bitline, and a NMOS having said source and drain coupled to GND and further to said bitline, wherein a gate of said NMOS is controlled by said mode-dependent-pull down circuit, discharging said bitline to said first condition by turning on said first NMOS when in said Programming mode, discharging said true bitline to said second condition by turning on said second NMOS for a first period in said true circuit and discharging said complement bitline to said third condition by turning on said second NMOS in said complement circuit for a second period longer than said first period when in said Read mode.

9. The bitline and complement circuit recited in claim 6, wherein each of said mode-dependent pull-down circuit comprises a PMOS having said source and drain coupled to said bitline high voltage (VBLH) and said bitline, and a first NMOS having said drain coupled to said bitline, and said second NMOS having said drain and source coupled to said source of the first NMOS, GND, and said gate of said true circuit coupled to a first analog voltage (VREF), and said gate of said complement circuit coupled to a second analog voltage (VREF2), discharging said true bitline to said first condition by turning on said first NMOS in said true circuit using a higher voltage of VREF when in said Programming mode, and discharging said true bitline to said second condition by turning on said second NMOS in said true circuit using a lower voltage of said VREF and discharging said complement bitline to said third condition by turning on said second NMOS in said complement circuit using VREF2 when in said Read mode.

10. A bitline and complement circuit recited in claim 9, wherein said VREF in said Read mode is lower than said VREF2.

11. An Embedded Multi-Time-Read-Only-Memory (eMTPROM) including two NMOS memory arrays, each of which is coupled to a plurality of wordlines, bitlines, and a sourceline, and at least one reference wordline and bitline drivers having a mode dependent pull down circuit, each of which coupled to each bitline and one shared sense amplifier coupled to said bitlines from first array and said bitlines from a second array, activating said wordline in a first one of two arrays, and in said reference wordline in a second one of said two arrays, thereby creating a differential bitline voltage by activating said first mode dependent pull down device from an activated array, and a second mode dependent-pull-down device from the reference array, said mode-dependent pull-down circuit comprising: a PMOS having a source and drain coupled to a bitline high voltage (VBLH) and further connected to said bitline, and a first NMOS having said source and drain coupled to GND, and further to said bitline, a second NMOS having said source and drain coupled to GND and further connected to the said bitline, a third NMOS having said source and drain coupled to GND and further to the said bitline, respectively, discharging said bitline to a first condition by turning on said first NMOS when in said Programming mode for said activated array, and discharging said bitline to a second condition by turning on a second NMOS for said activated array when said wordline is activated, discharging said bitline to a third condition by turning on a third NMOS for said reference array when said reference wordline is activated when in said Read mode.

12. The bitline circuit recited in claim 11, wherein said first NMOS is greater than said second and said third NMOS.

13. The bitline circuit as recited in claim 12, wherein said third NMOS threshold is lower than said second NMOS threshold.

14. The bitline circuit as recited in claim 12, wherein said third NMOS device size is greater than said second NMOS device size.

15. The bitline circuit as recited in claim 11 further comprising a sense amplifier, wherein said sense amplifier comprises a protection NMOS coupled to a sense node and further connected to said bitline by connecting said gate to VDD.

* * * * *